United States Patent [19]

Nagatomo et al.

[11] Patent Number: 5,164,806
[45] Date of Patent: Nov. 17, 1992

[54] ELEMENT ISOLATING STRUCTURE OF SEMICONDUCTOR DEVICE SUITABLE FOR HIGH DENSITY INTEGRATION

[75] Inventors: Masao Nagatomo; Hiroki Shimano; Tomonori Okudaira; Yoshinori Okumura, all of Hyogo, Japan

[73] Assignee: Mitsubishi Denki Kabushiki Kaisha, Tokyo, Japan

[21] Appl. No.: 698,690

[22] Filed: May 13, 1991

[30] Foreign Application Priority Data

May 23, 1990 [JP] Japan .................................. 2-132998
Jun. 25, 1990 [JP] Japan .................................. 2-170801

[51] Int. Cl.$^5$ ..................... H01L 29/06; H01L 27/04; H01L 29/34; H01L 29/40
[52] U.S. Cl. .................................... 257/395; 257/408; 257/409; 257/900
[58] Field of Search ..................... 357/23.9, 50, 52, 53

[56] References Cited

U.S. PATENT DOCUMENTS 4,095,251 6/1978 Dennard et al. .................. 357/23.9

FOREIGN PATENT DOCUMENTS

| 49-23071 | 6/1974 | Japan . |
| 50-9390 | 4/1975 | Japan . |
| 51-34274 | 9/1976 | Japan . |
| 56-91472 | 7/1981 | Japan .................. 357/23.9 |
| 60-98666 | 6/1985 | Japan . |
| 61-258475 | 12/1986 | Japan . |
| 62-48028 | 3/1987 | Japan . |
| 62-244163 | 10/1987 | Japan . |
| 63-312651 | 12/1988 | Japan . |

Primary Examiner—Rolf Hille
Assistant Examiner—Robert Limanek
Attorney, Agent, or Firm—Lowe, Price, LeBlanc & Becker

[57] ABSTRACT

An element isolating structure employed for isolating the elements of a semiconductor substrate has an impurity region having a concentration lower than that of a source/drain and a channel stop region, between the source/drain of an MOS transistor formed in an active region, and the channel stop region formed under an LOCOS film.

A field shield isolating structure has a low concentrated impurity region between the source/drain of an MOS transistor formed in the active region and the substrate surface region covered by a field shield electrode layer. The low concentrated impurity region improves its junction breakdown voltage in the boundary region with the element isolating region.

An improved LOCOS film is formed into an amorphous region on the surface of the substrate by an oblique rotating ion implanting method, and the amorphous region is formed by thermal oxidation. The method suppresses the emergence of a bird's beak.

11 Claims, 22 Drawing Sheets

ELEMENT ISOLATING STRUCTURE OF SEMICONDUCTOR DEVICE SUITABLE FOR HIGH DENSITY INTEGRATION

BACKGROUND OF THE INVENTION

1. Field of the Invention

The present invention relates to a manufacturing method of a miniaturized structure of an element isolating film formed on the surface of a semiconductor substrate, a structure capable element isolating characteristics and the manufacturing method thereof.

The present invention relates to a structure capable of improving junction breakdown voltage in an isolating region in a field shield isolating structure and to the manufacturing method thereof.

2. Description of the Background Art

In a semiconductor integrated circuit, a variety of element isolating structures have been proposed for insulating and isolating a number of semiconductor elements formed on a silicon substrate.

Description will be given on an element isolating structure utilizing so called LOCOS (Local Oxidation of Silicon) isolating films.

FIG. 14 is a sectional view schematically showing a structure of a semiconductor device, e.g. a semiconductor storage device such as a memory in section. Referring to FIG. 14, on the surface of a p type silicon substrate formed are an element forming region L2 on which an MOS transistor 2 is formed and an element isolating region L1 on which a field oxide film 7 is formed. The MOS transistor 2 includes a gate electrode 3 formed on the surface of the p type silicon substrate 1 with a gate insulating film 4 therebetween. The top and the side of the gate electrode 3 is covered with an upper oxide film 18 and a sidewall oxide film 17. A pair of source/drain regions 5a, 5b are formed on the surface of the silicon substrate 1. The source/drain regions have a so-called LDD (Lightly Doped Drain) structure formed of the n+ impurity region 5a of high concentration and the n− impurity region 5b of low concentration.

The field oxide film 7 formed in the element isolating region has a large thickness. The field oxide film 7 is formed by the LOCOS method. A channel stop layer 8 formed of a p+ impurity region having a concentration higher than that of the substrate 1 is formed under the field oxide film 7. The channel stop layer 8 is provided to improve element isolating ability by preventing an inversion layer from being formed in the region by means of increasing the concentration of the substrate in the underlying region of the field oxide film 7.

FIG. 14 shows an electrode layer 6 which extends over the upper portion of, for example, the field oxide film 7.

Now, description will be given on the manufacturing method of the semiconductor device shown in FIG. 14 by referring to FIGS. 15A–15G.

Referring to FIG. 15A, an underlying oxide film 14, a nitride film 9 and a resist 10 are sequentially formed on the p type silicon substrate 1. A prescribed form of opening is formed by patterning the resist 10 and the nitride film 9 using a lithography method and an etching method.

Now, referring to FIG. 15B, p type impurity ions 12 such as boron are implanted onto the surface of the silicon substrate 1, using the patterned resist 10 and the nitride film 9 as masks.

Referring to FIG. 15C, the field oxide film 7 having a thickness of thousands of Å is formed by vapor oxidation of the silicon substrate 1. At the time, the boron ions 12 are diffused in the substrate, thereby forming the channel stop layer 8.

Referring to FIG. 15D, the nitride film 9 and the underlying oxide film 14 are removed. A gate oxide film 4 having a thickness of tens of Å is formed again on the surface of the silicon substrate 1 by performing thermal oxidation. By utilizing a CVD (Chemical Vapor Deposition) method, a polysilicon layer 3 having a thickness of thousands of Å is formed on the surface thereof, on the surface of which an oxide film 18 is formed.

Referring to FIG. 15E, upon applying the resist 10 on the surface of the oxide film 18, patterning is carried out thereon, and the oxide film 18 and the polysilicon layer 3 are patterned into a prescribed form using the patterned resist 10 as a mask, thereby forming the gate electrode 3 or the electrode layer 6.

Now, referring to FIG. 15F, a first amount of n type impurity ions 19 is implanted into the silicon substrate 1 utilizing the gate electrode 3, etc. as a mask, so that an n− impurity region 5b of low concentration is formed.

Referring to FIG. 15G, sidewall oxide films 17 are formed on the sidewalls of the gate electrode 3 and then a highly concentrated n+ impurity region 5a is formed by implanting a second amount of n type impurity ions 20 onto the surface of the silicon substrate 1, using the sidewall oxide films 17 as masks. The semiconductor device shown in FIG. 14 is manufactured by the above described process.

There exist, however, the following problems in a conventional element isolating structure as described above.

So called bird's beaks are formed on the opposing ends of the field oxide film 7 formed by the conventional LOCOS method. In other words, the formation of a bird's beak region in FIG. 14 increases the width of the element isolating region $L_1$ and reduces the area of the element forming region $L_2$, thereby preventing high density integration of the element structure.

Another problem concerned is that a junction region is formed in which the highly concentrated channel stop layer 8 formed under the field oxide film 7 is in a direct contact with the highly concentrated n+ impurity region 5a of the MOS transistor 2 and, therefore, it was difficult to keep the junction breakdown voltage of the region at a high level.

Now, description will be given on another example of an element isolating structure in a semiconductor integrated circuit which employs a field shield method using a high resistance at the time of a reverse bias in a pn junction. FIG. 16 is a sectional view of an isolating structure of an MOS transistor produced in accordance with a conventional field shield method. In the figure, two MOS transistors 2, 2 adjacent to each other are insulated and isolated by a field shield isolation 10. The MOS transistor 2 includes a gate electrode 4 formed on the surface of a p type silicon substrate 1 with a gate insulating film 3 therebetween, and a pair of source/drain regions 5, 5 formed in the surface of the p type silicon substrate having a prescribed space therebetween. The upper surface and the side surface of the gate electrode 4 are each covered with an upper insulating layer 6a and side insulating layers 6b, respectively. The field shield isolation 10 includes a field shield electrode layer 12 formed on the surface region of the p type silicon substrate 1 between each of source/drain regions 5, 5 of the adjacent MOS transistors 2, 2 having a shield gate insulating layer 11 therebetween. The field shield electrode layer 12 is formed surrounding the region on which the MOS transistor 2 is formed. The upper surface and the side surface of the field shield gate electrode 12 are covered with an upper insulating layer 13a and side insulating layers 13b, respectively.

Now, description will be given on the operation of the field shield isolation 10. FIG. 17 is a view showing the operation of a conventional field shield isolation. The field shield isolation 10 constitutes a transistor structure by the n+ source/drain regions 5, 5 of the MOS transistor disposed adjacent to each other, the shield gate insulating layer 11 and the field shield electrode layer 12. A negative voltage is applied to the field shield gate electrode 12 so that the transistor is reversely biased, and holes are induced beneath the shield gate insulating layer 11, thereby changing the type of the surface region of the p type silicon substrate 1 between the two n+ source/drain regions 5, 5 from p type to p+ type to form a p+ region 16. An $n^{30}p^{30}n^+$ structure is therefore formed between the adjacent MOS transistors, thereby performing insulation and isolation between the two MOS transistors.

In the above described field shield isolation structure, a silicon oxide film having a thickness of thousands of Å in the isolating region is formed, and the entire device is advantageously flattened, when compared to a so-called LOCOS (Local Oxidation of Silicon) method in which development of an n type inversion layer on the surface of a substrate is prevented by increasing the threshold voltage of an isolating portion.

Now, description will be given on the manufacturing method of a semiconductor device having the field shield isolation shown in FIG. 16. FIGS. 18A-18E are sectional views showing the manufacturing process of the semiconductor device shown in FIG. 16.

As shown in FIG. 18A, the surface of a p type semiconductor substrate is thermally oxidized, thereby forming a silicon oxide film 22 having a thickness of some tens of Å. Further, a polysilicon layer 23 having a thickness of some thousands of Å and an oxide film 24 having a thickness of some thousands Å of are sequentially deposited on the surface of the silicon oxide film 22 by a CVD method (Chemical Vapor Deposition) Resists 21 are applied onto the surface of the oxide film 24 and patterning into a prescribed form is performed thereon, using a lithography method or an etching method.

Subsequently, as shown in FIG. 18B, using the patterned resists 21 as masks the oxide film 24, the polysilicon layer 23 and the thermal oxide film 22 are sequentially patterned to form the gate insulating film 3, the gate electrode 4, the upper insulating layer 6a of the MOS transistor as well as the shield gate insulating layer 11, the field shield electrode layer 12 and the upper insulating layer 13a of the field shield isolating structure.

Furthermore, as shown in FIG. 18C, an oxide film 29 oxidized at a high temperature having a thickness of some thousands of Å is deposited on the surface of the p type silicon substrate 1, after the resists 21 being removed.

As shown in FIG. 18D, the high temperature oxide film 29 is anisotropically and selectively etched to be removed, and then sidewall insulating layers 6b and, 13b are formed on the sidewalls of the gate electrode 4 and the field shield electrode layer 12, respectively.

Subsequently, as shown in FIG. 18E, phosphoric ions 30 are implanted onto the surface of the p type silicon substrate, using as masks the gate electrode 4 and the field shield electrode layer 12 covered by the upper insulating layers 6a and 13a and the sidewall insulating layers 6b and 13b, respectively, thereby forming n+ source/drain regions 5, 5. The semiconductor device comprising the field shield isolating structure is manufactured in accordance with the above described process.

Referring back to FIG. 17, in the conventional field shield isolating structure, an n+p+ junction is formed between the source/drain region 5 of the MOS transistor and the isolation region. In such a highly concentrated pn junction region, its junction breakdown voltage becomes low because its depletion layer has its extent restricted.

As a conventional technique related to the present invention, for example, a field shield isolating structure provided with a shield electrode having a shield gate insulating film thicker than the gate insulating film of an adjacent MOS transistor in order to increase the threshold voltage of the field shield isolating structure is disclosed in Japanese Patent Laying Open 62-244163, or a manufacturing method of an LDD structure by an oblique rotating ion implantation method is disclosed in Japanese Patent Laying Open 61-258475.

SUMMARY OF THE INVENTION

One object of the present invention is to miniaturize the element isolating structure of a semiconductor device.

Another object of the present invention is to form a field oxide film with a reduced bird's beak region.

Another object of the present invention is to improve junction breakdown voltage at a field oxide film end.

A further object of the present invention is to improve junction breakdown voltage at an end of a field shield isolating structure.

Yet another object of the present invention is to provide a manufacturing method of an element isolating structure using a field oxide film having improved breakdown voltage at its ends.

Still another object of the present invention is to provide a manufacturing method of a field shield isolating structure having improved junction breakdown voltage at its ends.

In a first aspect of the present invention, a semiconductor device includes a semiconductor substrate of a first conductivity type which has an element formation region, on the main surface of which semiconductor elements are formed. An element isolating region surrounds the element formation region. A gate electrode is formed on the surface of the semiconductor substrate in the element formation region with a gate insulating layer therebetween; and a pair of highly concentrated impurity regions of a second conductivity type are formed having a prescribed distance apart to each other in the semiconductor substrate on the opposing sides of the gate electrode. A pair of low concentrated impurity regions of the second conductivity type are arranged adjacent to the highly concentrated impurity region of the second conductivity type and are formed in a semiconductor substrate region immediately below the gate electrode. An element isolating and insulating film is formed on the surface of the semiconductor substrate portion in the element isolating region. The element isolating region also includes channel stop region of the first conductivity type formed adjacent to the lower part of the element isolating and insulating film in the semiconductor substrate and a low concentrated impurity region of the first conductivity type formed adjacent and between the channel stop region and the high concentrated impurity region of the second conductivity type.

The formation of the low concentrated impurity region of the first conductivity type between the highly concentrated impurity region of the second conductivity type and the highly concentrated channel stop region of the first conductivity type of the MOS transistor is increases junction breakdown voltage by relaxing the concentration distribution of a pn junction formed in the region and expanding the formation area of the depletion layer.

In a second aspect of the present invention, a manufacturing method of a semiconductor device including an MOS transistor of an LDD structure in a region surrounded by an element insulating film on the main surface of a semiconductor substrate of a first conductivity type comprises the following manufacturing steps.

An oxide resisting film and a resist are formed on the main surface of the semiconductor substrate, and, then patterning into a prescribed form is performed thereon. An impurity of the first conductivity type is introduced into the semiconductor substrate by ion implantation using the patterned resist and the oxide resisting film as masks. An element isolating film is formed on the surface of the semiconductor substrate which is not covered with the oxide resisting film due to thermal oxidation treatment being applied to the part, and at the same time, a channel stop layer of the first conductivity type in line with the lower part is formed. Furthermore, a gate insulating film and a gate electrode are formed on the surface of the semiconductor substrate portion in the element formation region after the surface region of the semiconductor substrate positioned in the element formation region surrounded by the element isolating film being exposed. An impurity of a second conductivity type is introduced by ion implantation in an oblique direction relative to the main surface of the semiconductor substrate using the gate electrode as a mask, and a first impurity region of a relatively low concentration is formed in the semiconductor substrate in the vicinity of the side end plane of the gate electrode, a low concentrated impurity region of the first conductivity type adjacent to the channel top layer being formed in the semiconductor substrate in the vicinity of the end plane of the element isolating film. After an insulating layer is formed at least at the sidewall of the gate electrode, an impurity of the second conductivity type is implanted by ion implantation approximately vertically relative to the main surface of the semiconductor substrate using the gate electrode having the sidewall insulating layer formed thereon as a mask, thereby forming a second impurity region having a relatively high concentration in contact with the first impurity region of low concentration and the low concentrated impurity region of the first conductivity type.

The above described low concentrated impurity region of the first conductivity type forms a low concentrated impurity region of the LDD structure of MOS transistor and, therefore, can be formed using an ion implantation process. Thus, additional manufacturing process will not be necessary.

In a third aspect of the present invention, the manufacturing method of an element isolating oxide film includes the steps in the following.

An oxide resisting film and a mask layer are formed on the main surface of a semiconductor substrate, and the oxide resisting film portion and the mask layer positioned in a region to be an isolating region between elements are selectively removed to form an opening in a prescribed form. Ion implantation is conducted in an oblique direction relative to the main surface of the semiconductor substrate in the opening by rotating the semiconductor substrate using the mask layer as a mask for ion implantation, thereby forming an amorphous region in the center of the opening of the semiconductor substrate. Further, upon thermal oxidation treatment a field oxide film is formed on the main surface of the semiconductor substrate in the opening of the oxide resisting film.

In this method, only the central region of the substrate surface positioned in the opening region of the mask layer is turned into an amorphous state using the oblique ion implantation method. Upon the thermal oxidation of the silicon layer in an amorphous state, a thicker oxide film is formed in a shorter period of time by enhanced oxidation compared to otherwise produced polysilicon regions. A field oxide film having a prescribed film thickness is thus formed before a bird's beak extends in the direction of the substrate plane. Thus, a miniaturized element isolating oxide film having its bird's beak region reduced can be manufactured.

In a fourth aspect of the present invention, a semiconductor device includes a semiconductor substrate of a first conductivity type having a plurality of element formation regions in which semiconductor elements are formed and having an element isolating region for insulating and isolating each of the element formation regions by surrounding the vicinity of the element formation regions; a gate electrode formed extending in a prescribed direction on the element formation region with a gate insulating layer therebetween; a second impurity region of second conductivity type having a relatively high concentration formed in the semiconductor substrate surface region, one side of which is in contact with the first impurity region and which is surrounded by the gate electrode and the element isolating region; a shield gate insulating layer formed on the main surface of the semiconductor substrate positioned in the element isolating region surrounding the element formation region; and a field shield gate electrode layer formed on the surface of the shield gate insulating layer.

The semiconductor device is characterized in that the device is formed on the surface region of the semiconductor substrate around the boundary between the element isolating region and the element formation region, and the third impurity region of the second conductivity type having lower concentration than the second impurity region, is formed making the thickness of the shield gate insulating layer larger than that of the gate insulating layer.

In the semiconductor device the shield gate insulating layer is formed to be relatively thick, reducing the concentration of the impurity region to be induced in the substrate region beneath the field shield electrode layer and, at the same time, forms an impurity region of the second conductivity type having a relatively low concentration in the circumference of the highly concentrated second impurity region. Thus, junction breakdown voltage is increased by expanding the width of a depletion layer in the junction part in the vicinity of the isolating region toward the side of the low concentrated impurity region of the second conductivity type.

In a fifth aspect of the present invention, the semiconductor device is characterized in that the device is formed on the surface of the semiconductor substrate around the boundary between the element isolating region and the element formation region, and the third impurity region of a first conductivity type having a concentration lower than that of the semiconductor substrate, the shield gate insulating layer being as thick as the gate insulating layer.

In the semiconductor device, the manufacturing process is simplified by making the thickness of the shield gate insulating layer to be equal to that of the gate insulating layer of the adjacent MOS transistor, and the width of the depletion layer is expanded by permitting the impurity region formed in the circumference of the highly concentrated second impurity region of the second conductivity type to have the same conductivity type as that of the substrate and to have a lower concentration than that of the substrate.

In a sixth aspect of the present invention, a manufacturing method of a semiconductor device including an MOS transistor having an LDD structure and an element isolation region having a field shield electrode surrounding the transistor for insulation and isolation thereof comprises the following steps.

The shield gate insulating layer having a prescribed film thickness is selectively formed in a position to be the element isolating region of the surface of the semiconductor substrate of a first conductivity type, and a gate insulating layer having a smaller thickness than that of the shield gate insulating layer is formed on the main surface of the semiconductor substrate. Subsequently, a polysilicon layer and a first insulating layer are each formed on the surfaces of the shield gate insulating layer and the gate insulating layer, and patterning is performed thereon to form a gate electrode and a shield gate electrode layer. An impurity region having a relatively low concentration is formed by implanting impurity ions of a second conductivity type in the semiconductor substrate by an oblique rotating ion implantation method, using the gate electrode and the field shield electrode layer as masks. Further, sidewall insulating layers are formed on the sidewalls of the gate electrode and the field shield electrode layer. Then, an impurity region having a relatively high concentration is formed in the main surface of the semiconductor substrate by implanting impurity ions of the second conductivity type in an approximately vertical direction relative to the surface of the semiconductor substrate, using as masks the gate electrode and the field shield electrode layer with the sidewall insulating layers formed thereon.

In the manufacturing method of the semiconductor device, the step of forming the low concentration impurity region of each LDD structure of adjacent MOS transistors is used also for forming the low concentrated impurity region for relaxing the electric field of the junction in the vicinity of the isolating region. The application of the oblique rotating ion implantation method permits the low concentrated impurity region in the MOS transistor to slip onto the surface of the substrate immediately below the gate and, at the same time, a part of the low concentrated impurity region for field relaxation to slip into the substrate region immediately below the field shield electrode.

In a seventh aspect of the present invention, a manufacturing method of a semiconductor device comprises the following steps.

A shield gate insulating layer having a prescribed thickness is formed in a position to be the element isolating region of the surface of a semiconductor substrate of a first conductivity type and then a gate insulating layer having a thickness smaller than that of the shield gate insulating layer is formed on the main surface of the semiconductor substrate. A polysilicon layer and a first insulating layer are formed on the surfaces of the shield gate insulating layer and the gate insulating layer and patterning is performed thereon to form a shield gate electrode layer. Subsequently, a first sidewall insulating layer is formed on the sidewall of the field shield electrode layer. Further, a gate electrode of a polysilicon layer and a second insulating layer thereon are formed and simultaneously patterned on the surface of the gate insulating layer. An impurity region having a relatively low concentration is then formed by implanting impurity ions of a second conductivity type into the semiconductor substrate by an oblique rotating ion implantation method, using as a mask the field shield electrode layer in which the gate electrode and the first sidewall insulating layer are formed. A second sidewall insulating layer is then formed on the sidewalls of the gate electrode and the field shield electrode layer. An impurity region having a relatively high concentration is then formed on the main surface of the semiconductor substrate by implanting impurity ions of the second conductivity type in an approximately vertical direction relative to the main surface of the semiconductor substrate using as masks the gate electrode and the field shield electrode layer in which the second sidewall insulating layer is formed.

In the manufacturing method, the application of the oblique rotating ion implantation method of forming the low concentrated impurity region of each LDD structure of adjacent MOS transistors permits a part of the low concentrated impurity region of the LDD structure to get immediately under the gate electrode and, at the same time, in the field isolating region, a low concentrated impurity region for field relaxation is formed at a distance apart from the field shield electrode layer, thereby forming an offset structure.

In an eighth aspect of the present invention, a manufacturing method of a semiconductor device comprises the following steps.

A first insulating layer, a polysilicon layer, and a second insulating layer are formed on the main surface of the semiconductor substrate of a first conductivity type, and by patterning the layers into a prescribed form, the gate electrode and the field shield electrode layer of an MOS transistor are formed. Subsequently, an impurity region of a first conductivity type having a concentration lower than that of the semiconductor substrate is formed on the main surface of the semiconductor substrate by implanting impurity ions of a second conductivity type onto the main surface of the semiconductor substrate by an oblique rotating ion implantation method using as masks the gate electrode and the field shield electrode layer. A mask layer having a prescribed thickness is formed at least on the sidewall portion of the field shield electrode layer, and an impurity region of the second conductivity type having a relatively low concentration is formed on the main surface of the semiconductor substrate by implanting impurity ions of the second conductivity type by the oblique rotating ion implantation method, using as masks the field shield electrode layer and the gate electrode. After the mask layer being removed, sidewall insulating layers are formed on the sidewalls of the gate electrode and the field shield electrode layer. An impurity region having a relatively high concentration is formed within the surface of the semiconductor substrate by implanting impurity ions of the second conductivity type in an approximately vertical direction relative to the main surface of the semiconductor substrate using as masks the gate electrode and the field shield electrode layer in which the sidewall insulating layers are formed.

In the manufacturing method of the semiconductor device, the gate insulating layers of the adjacent MOS transistors and the shield gate insulating layer of the field shield isolating structure are manufactured to have the same thickness to each other in accordance with an identical process. The low concentrated impurity region for field relaxation in the vicinity of isolating region is formed by counter-doping impurity ions of a conductivity type opposite to that of the substrate by the oblique rotating ion implantation method, thereby forming the impurity region having a concentration lower than that of the substrate. The concentration of the impurity region for field relaxation is set to an optimal value by this counter-doping application.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
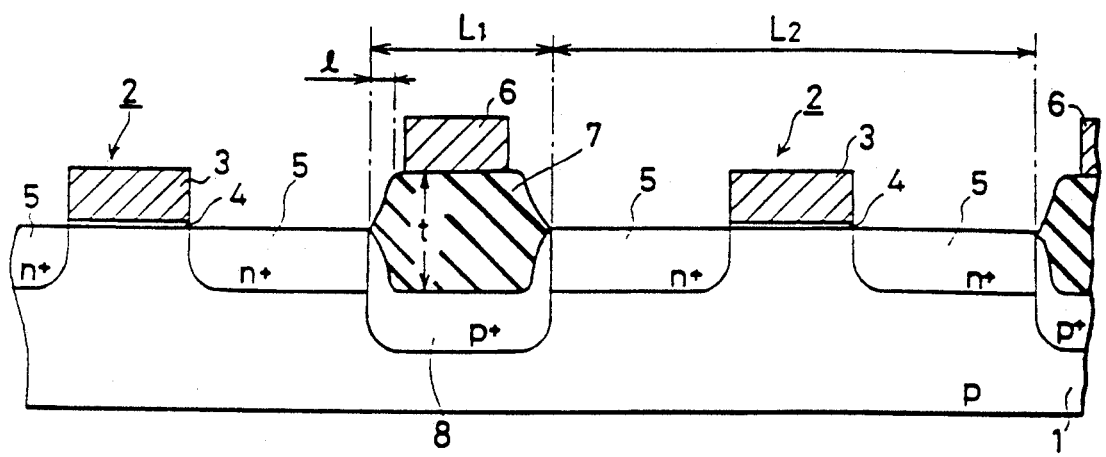
FIG. 1 is a sectional view showing a structure of a semiconductor device having an LOCOS isolation structure in accordance with a first embodiment.
Figure 14:
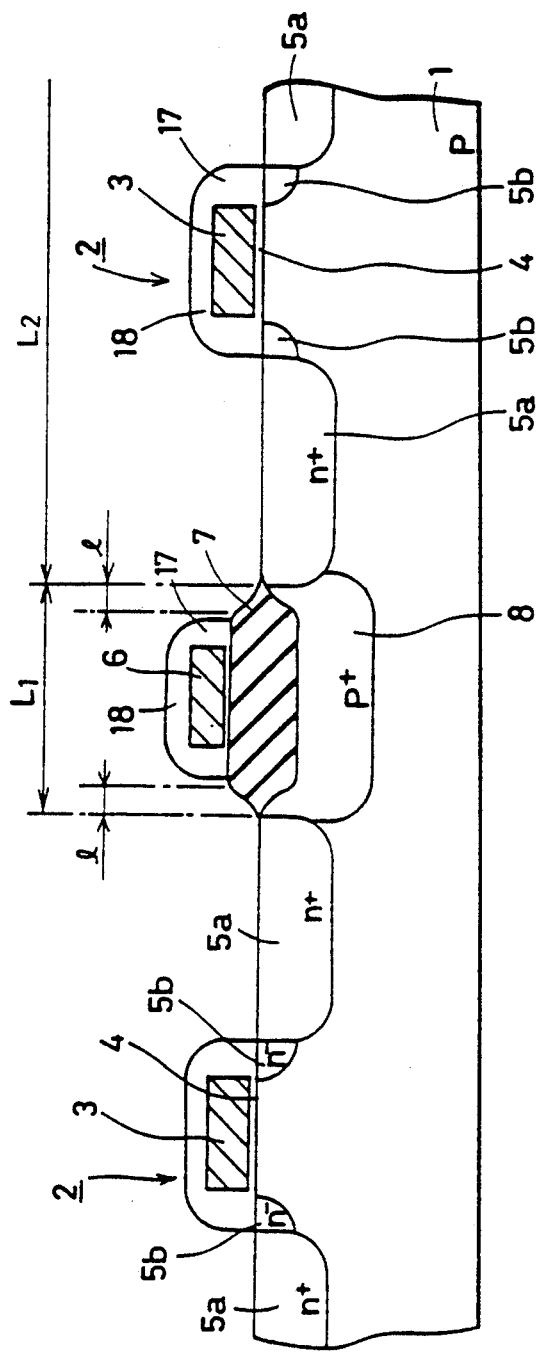
FIG. 14 is a sectional view showing a structure of a conventional semiconductor device.
Figure 15A:
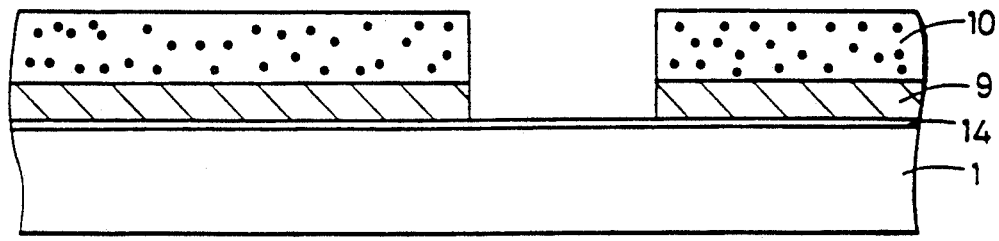
FIGS. 15A, 15B, 15C, 15D, 15E, 15F and 15G are sectional views showing the manufacturing process of the semiconductor device shown in FIG. 14.
Figure 15B:
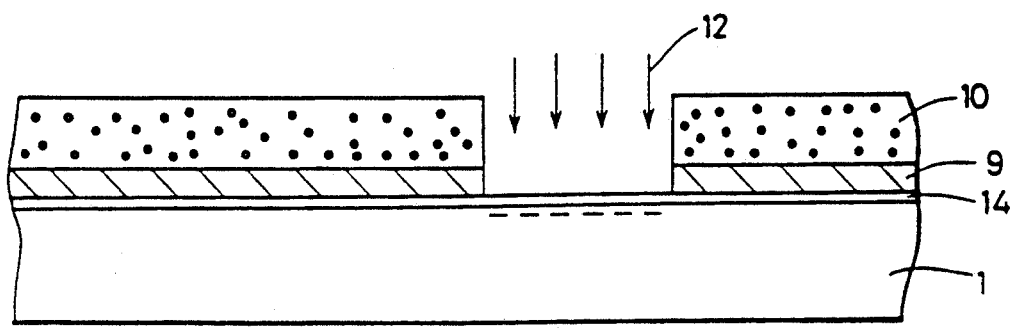
Figure 15C:
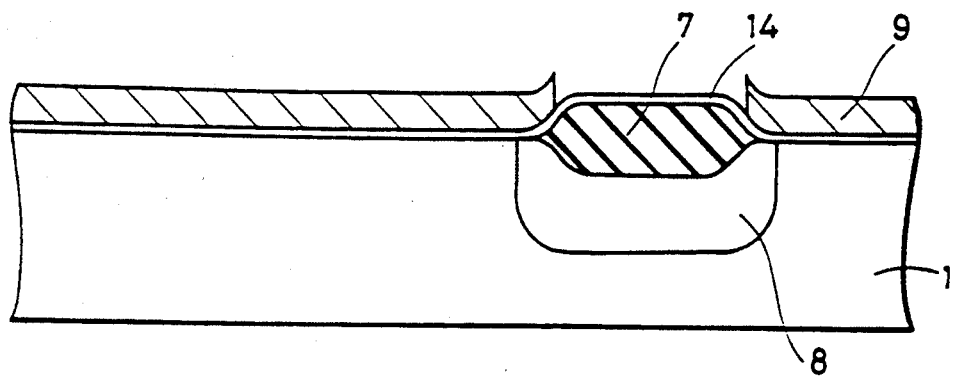
Figure 15D:
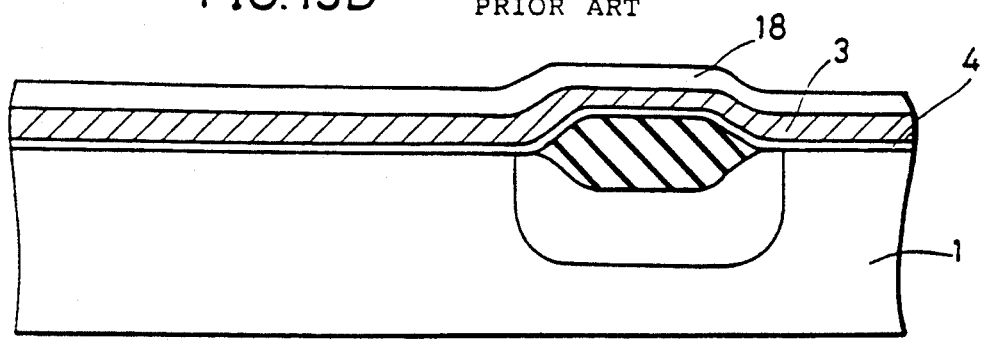
Figure 15E:
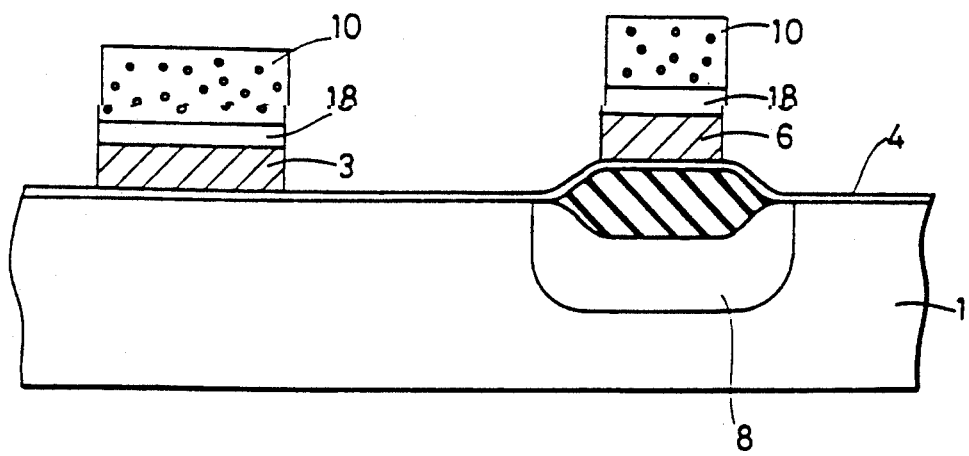
Figure 15F:
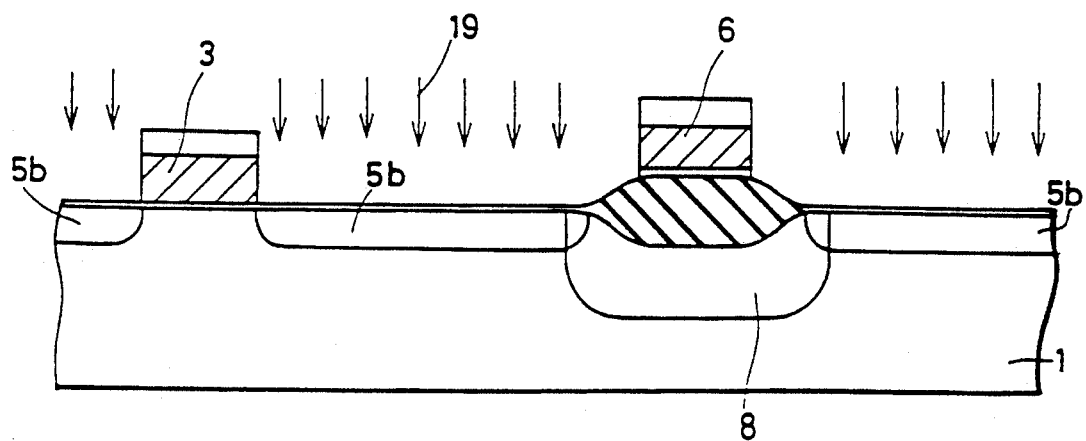
Figure 15G:
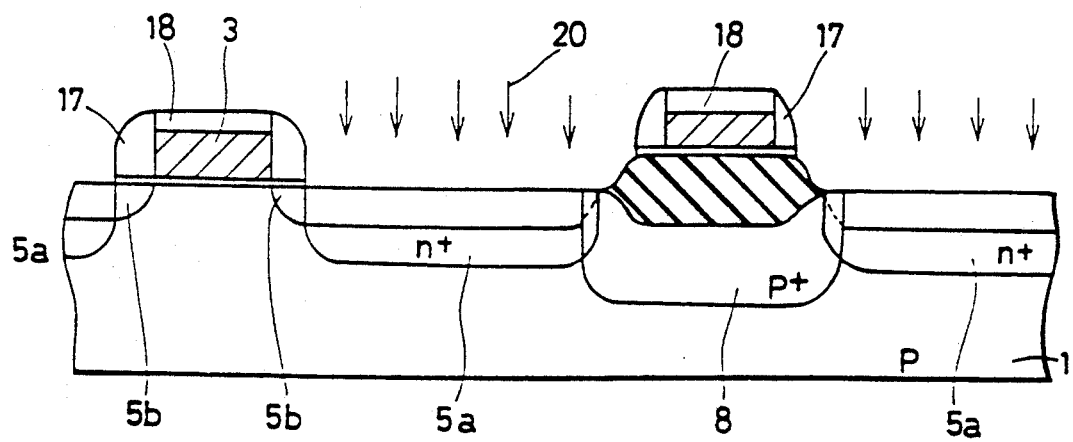
Figure 16:
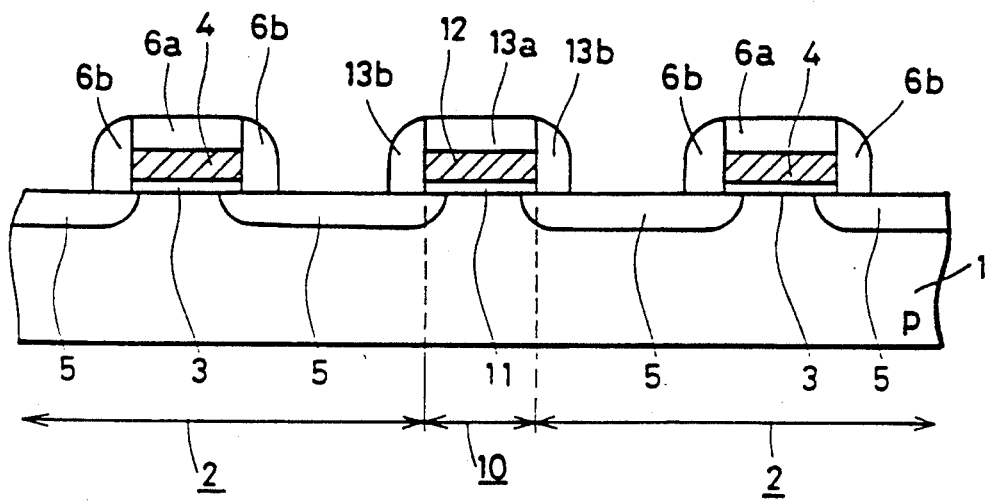
FIG. 16 is a sectional view showing structure of a semiconductor device having a conventional field shield isolating structure.
Figure 17:
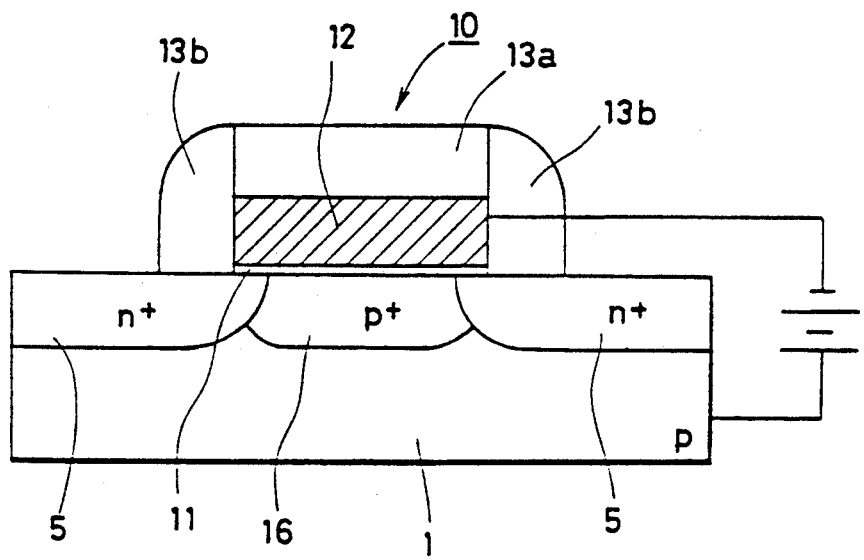
FIG. 17 is an operational diagram showing the field shield isolating structure shown in FIG. 16.
Figure 18A:
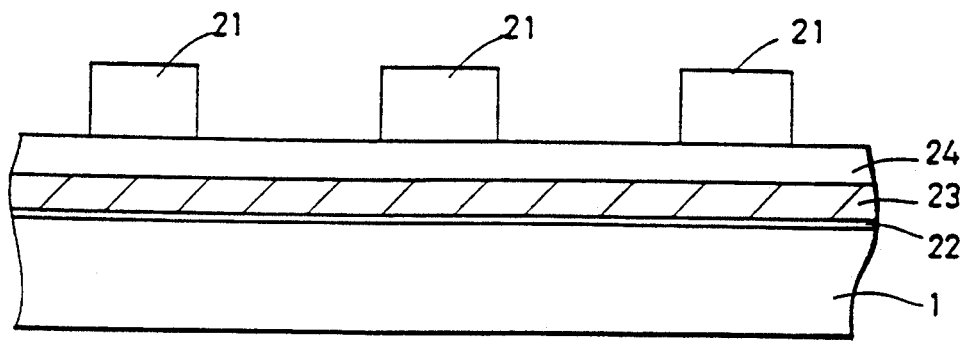
FIGS. 18A, 18B, 18C, 18D and 18E are sectional views showing the manufacturing process of the semiconductor device shown in FIG. 16.
Figure 18B:
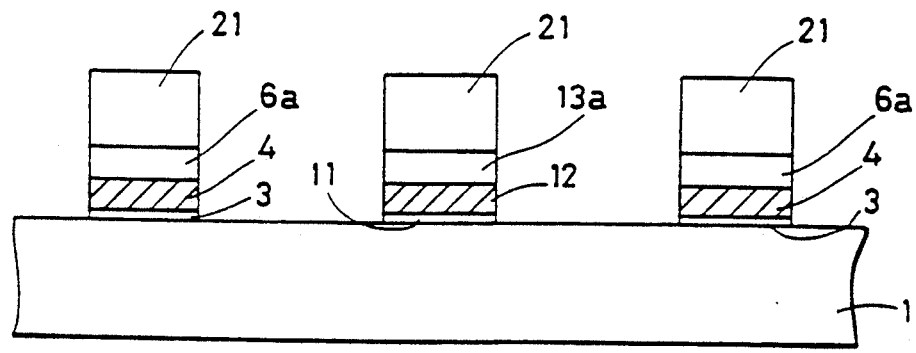
Figure 18C:
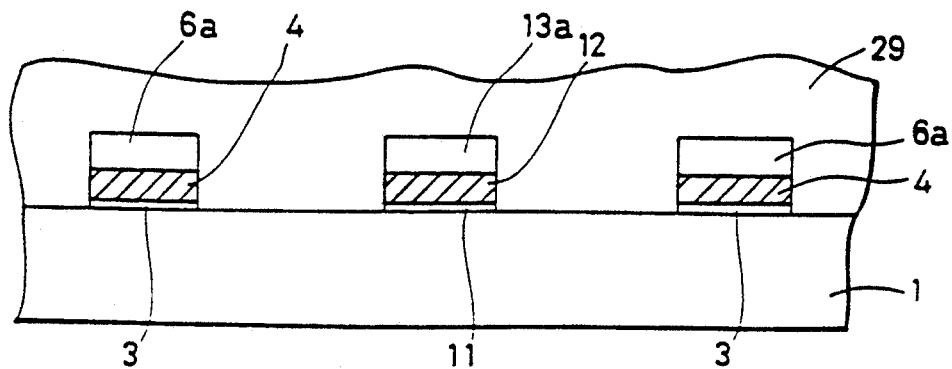
Figure 18D:
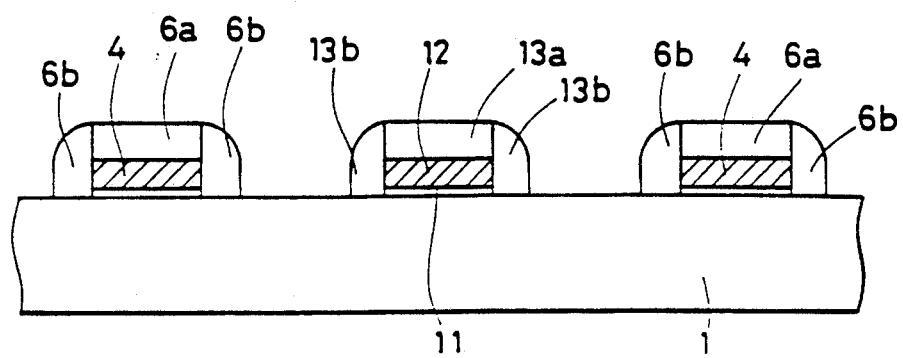
Figure 18E:
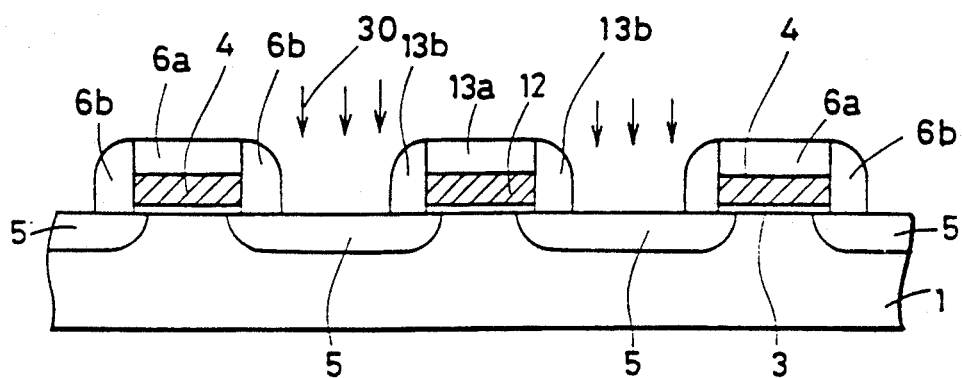

FIG. 1 is a sectional view showing structure of a semiconductor device in accordance with a first embodiment. Referring to FIG. 1, an MOS transistor 2 and a field oxide film 7 for isolating elements are shown on the surface of a p type silicon substrate 1. The MOS transistor 2 has source/drain regions 5, 5 formed of a pair of n+ impurity regions, and a gate electrode 3 positioned between the source/drain regions 5, 5 and formed on the surface of the silicon substrate 1 with a gate insulating film therebetween. The field oxide film 7 is formed between the adjacent MOS transistors 2, 2. The field oxide film 7 has a shorter bird's beak region 1 and a larger film thickness than a conventional field oxide film 7 shown in FIG. 14. When the thickness t is set to be the same as that of the conventional field oxide film 7, the width $L_1$ of the field oxide film 7 can be formed smaller than that of the conventional one. An electrode layer 6 being disposed on the top of the field oxide film 7, a channel stop layer 8 formed of a p+ impurity region of the same conductivity type as the substrate and of a concentration higher than that of the substrate is formed under the field oxide film 7.

Now, description will be given on the manufacturing method of the field oxide film shown in FIG. 1 in conjunction with FIGS. 2A to 2C.

Figure 2A:
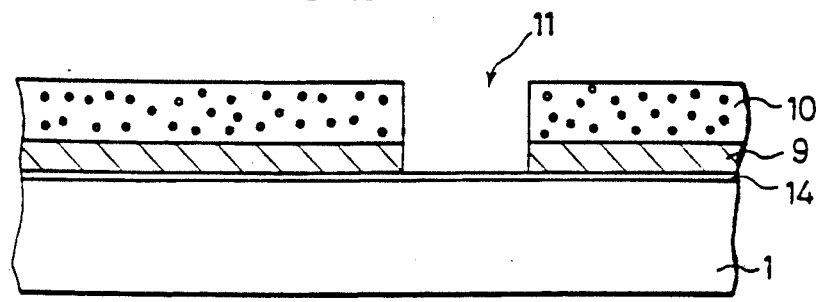
FIGS. 2A, 2B and 2C are sectional views showing the manufacturing process of the semiconductor device shown in FIG. 1.

Referring to FIG. 2A, an underlying oxide film 14 having a film thickness from 300 Å to 500 Å and a nitride film 9 having a film thickness from about 500 Å to 1000 Å are sequentially formed. A resist is applied onto the surface of the nitride film 9 in thickness ranging from about 5000 Å to 10000 Å. Patterning by a lithography method or an etching method is applied to pattern the resist 10 into a prescribed form, and the nitride 9 is selectively etched away using the patterned resist 10 as a mask. An opening 11 is thus formed. The width of the opening 11 defines the isolating width of the field oxide film 7.

Figure 2B:
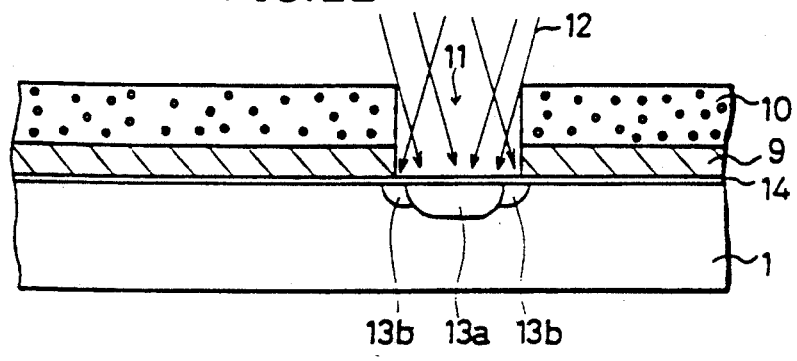

Now, referring to FIG. 2B, boron (B) ions 12 are implanted onto the surface of the silicon substrate 1 by an oblique rotating ion implantation method using the resist pattern 10 as a mask. In other words, the boron ions 12 are implanted in an oblique direction relative to the main surface of the silicon substrate 1 while rotating the silicon substrate 1. A highly concentrated impurity implanted region 13a is formed in the center of the opening 11 of the resist 10 on the exposed surface of the silicon substrate 1, a low concentrated impurity implanted region 13b being formed in the circumference thereof. Due to the process of implanting the boron ions 12, in the highly concentrated impurity implanted regions 13a, the silicon substrate 1 attains an amorphous state to form an amorphous region. On the other hand, in the low concentrated impurity implanted region 13b, the level of amorphous state is low and the concentration of the boron ions is also low. The amorphous region can be formed with a dose amount of $2 \times 10^{16}$ cm$^{-2}$ when the boron ions 12 are implanted. The boron ion implantation fulfills two functions at a time. One is to form the channel stop layer by implanting impurities (boron), and the other is to form the amorphous region in the vicinity of the center of the opening of the silicon substrate 1.

Figure 2C:
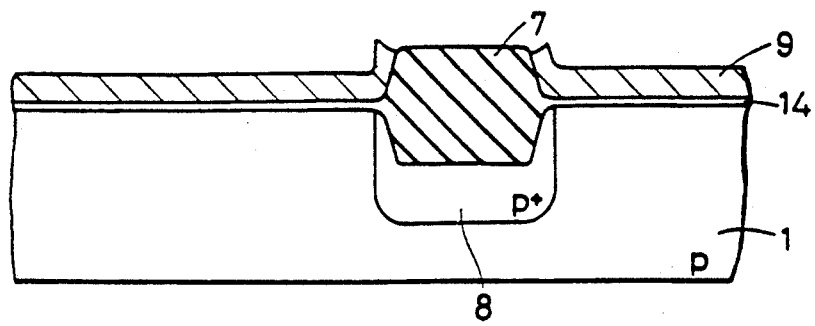

As shown in FIG. 2C, after the resist 10 is removed, vapor oxidation is performed thereon at a temperature of 800° C. for about 30 minutes, and then a field oxide film 7 is formed on the exposed surface of the silicon substrate in the opening 11 formed in the nitride film 9. It is known that silicon has a higher oxidation rate in an amorphous region than in a polysilicon region. The oxidation rate is therefore higher in the amorphous region 13a of the silicon substrate 1 which has attained an amorphous state by the boron ion implantation than in the impurity implanted region 3b surrounding the above region. Time required for attaining a prescribed oxide film thickness is therefore shortened compared to conventional cases. Time required for the formation of a bird's beak developing along the plane of the silicon substrate 1 is restricted compared to the conventional cases accordingly. Though the boron ions are diffused into the substrate due to the oxidation treatment, the diffusion region of the boron is small compared to the conventional, because the boron ions are implanted at a high concentration in the center of the opening, while at a low concentration in the surrounding portion thereof. The channel stop layer 8 formed by the diffusion of the boron is therefore formed under the field oxide film 7, thereby restricting the amount the boron to leak into the element formation region.

In the process of implanting ions shown in FIG. 2B, similar effects can be provided by employing the following process of implanting ions. That is, after forming an amorphous region by implanting silicon (Si) ions, argon (Ar) ions and oxygen (O$_2$) ions to turn the surface of the silicon substrate into an amorphous state, a p type impurity as a channel top layer, e.g. boron ions may be implanted. If the substrate is an n type silicon substrate, n type impurities, for example, phosphorus (P) or arsenic (As) may be used to form an amorphous region by an oblique ion implantation. Dose amount necessary for turning the silicon substrate into an amorphous state by these impurity ions is, for example, $6 \times 10^{14}$cm$^{-2}$ in case of silicon, $1 \times 10^{15}$cm$^{-2}$ in case of phosphorus, and $3 \times 10^{14}$cm$^{-2}$ in case of arsenic.

Figure 3:
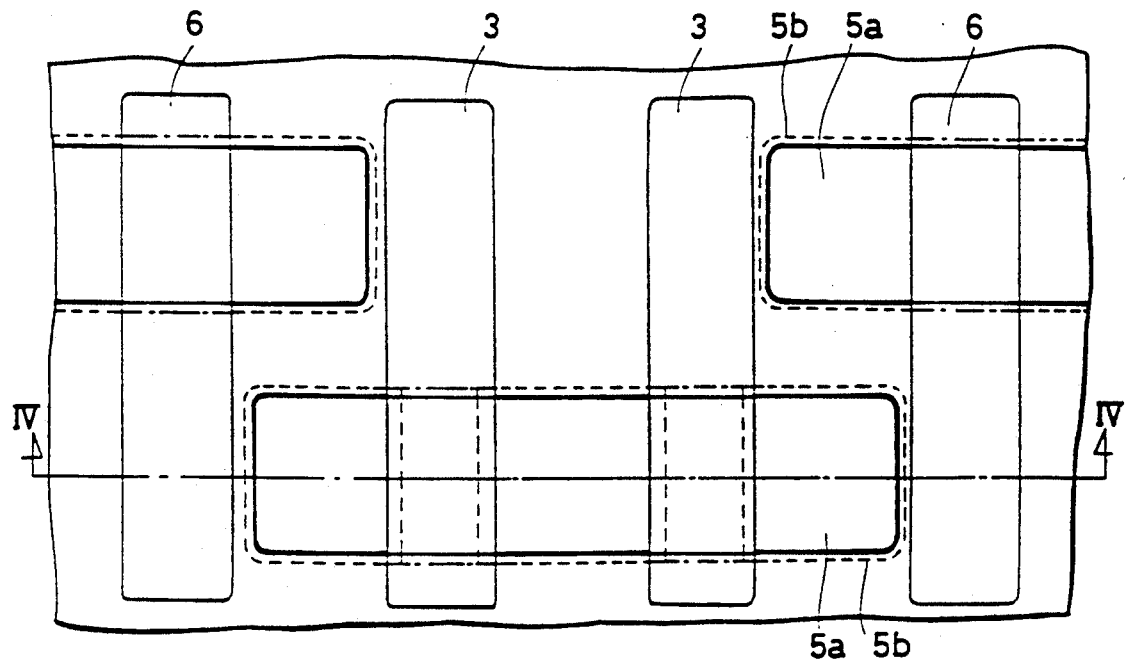
FIG. 3 is a top view of a structure of a semiconductor device in accordance with a second embodiment.
Figure 4:
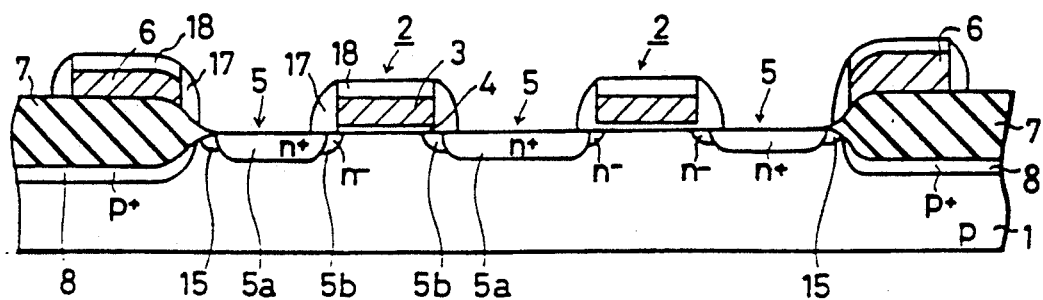
FIG. 4 is a sectional view of the structure shown in FIG. 3 taken along line IV—IV in FIG. 3.

Now, a second embodiment will be described. Referring to FIGS. 3 and 4, the embodiment is characterized in that a low concentrated p$^-$ impurity region 15 is formed between the highly concentrated n$^+$ impurity region 5a and the highly concentrated channel stop layer 8 of an MOS transistor having an LDD structure. The p$^-$ impurity region 15, upon application of a voltage reverse to the conjunction with the n$^+$ impurity region 5a, functions so as to increase the extent of a depletion layer formed in the junction region, unlike the conventional. Electric fields imposed to the junction plane is therefore relaxed, so that the junction breakdown voltage increases.

Now, description will be given on the manufacturing method of the semiconductor device shown in FIG. 4.

Figure 5A:
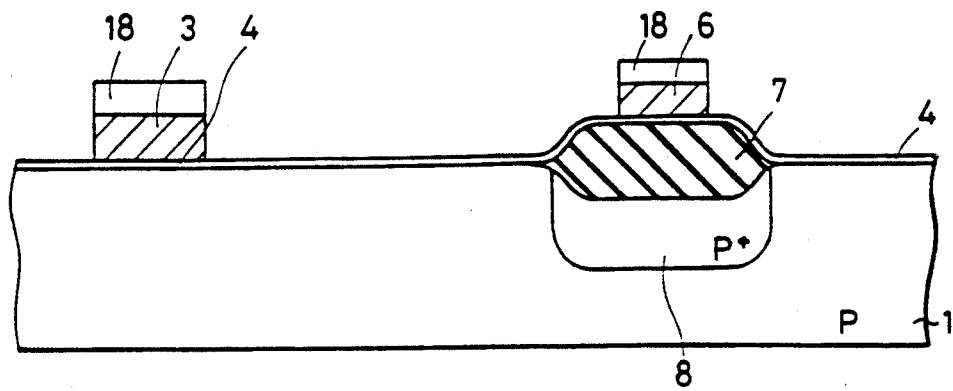
FIGS. 5A, 5B, 5C and 5D are sectional views showing the manufacturing process of the semiconductor device shown in FIG. 4.

Referring to FIG. 5A, on the surface of a p type silicon substrate 1 formed are a field oxide film 7 formed in accordance with an LOCOS method, a channel stop layer 8, and a gate electrode 3 or an electrode layer 6 patterned into a prescribed form.

Figure 5B:
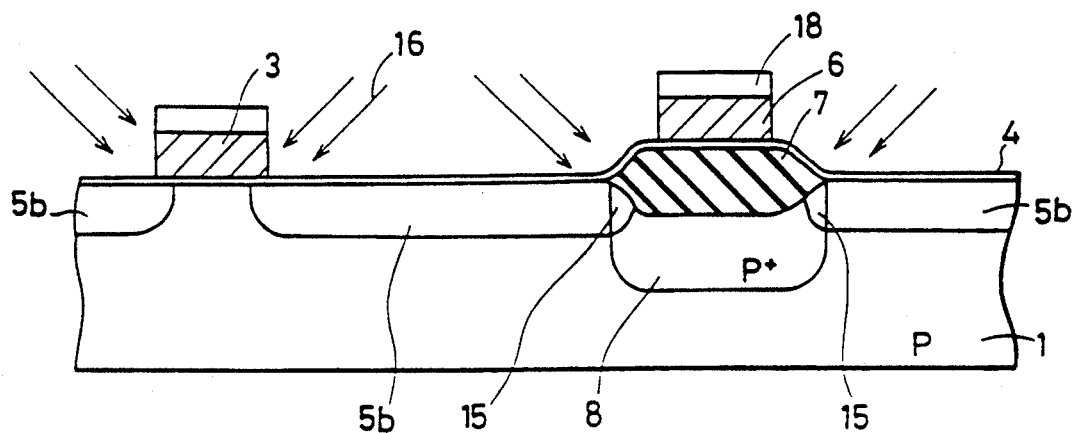

Referring to FIG. 5B, phosphorus ions 16 are implanted by an oblique rotating implantation using the gate electrode 3 and the field oxide film 7 as masks, thereby forming a low concentrated n$^-$ impurity region 5b on the surface of the silicon substrate 1. The n$^-$ impurity region 5b is formed so that a part of the same is slipped into the channel region of the MOS transistor. A low concentrated ($10^{16}$–$10^{18}$cm$^{-3}$) p$^-$ impurity region 15 is formed by the ion implantation at the end of the channel stop layer 8 formed of a p$^+$ impurity region on the side of the field oxide film 7.

Figure 5C:
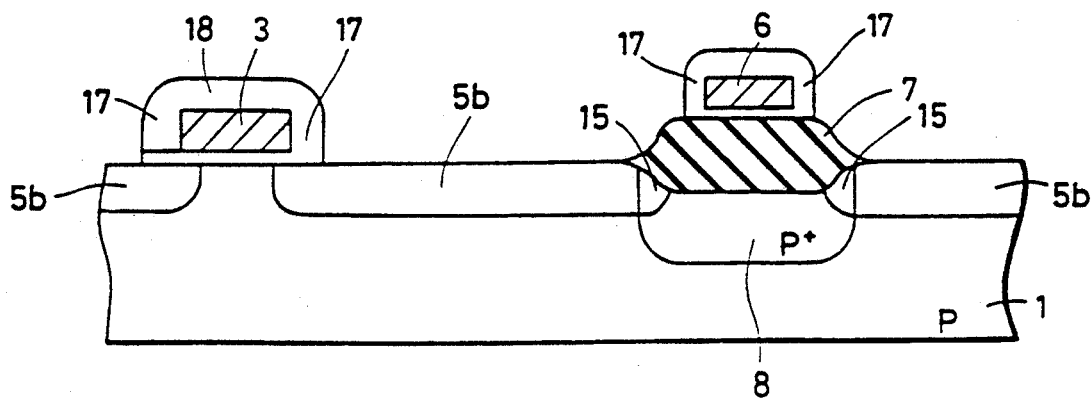

Further, referring to FIG. 5C, after depositing an oxide film over the entire surface of the silicon substrate 1, the oxide film is anisotropically etched to be removed selectively. A sidewall oxide film 17 is each formed on the sidewall of the gate electrode 3 and the sidewall of the electrode layer 6 due to the above described etching process.

Figure 5D:
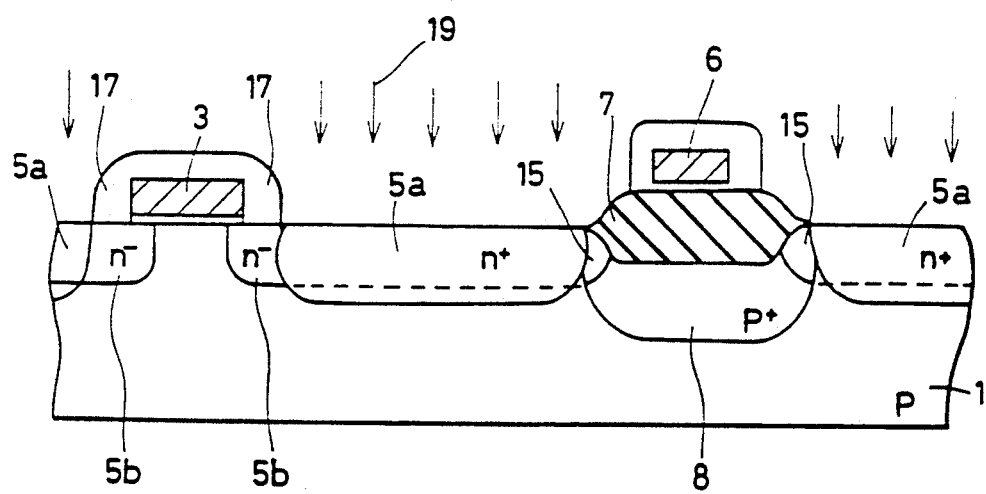

Referring to FIG. 5D, arsenic ions 19 into the surface of the silicon substrate 1 in an approximately vertical direction relative to the surface of the substrate using as masks the gate electrode 3 and the field oxide film 7 in which the sidewall oxide film 17 is formed, and then activation treatment is carried out. The highly concentrated n$^+$ impurity region 5a is thus formed, completing the LDD structure of the source/drain regions. Due to the above described process, at the end of the field oxide film 7, the low concentrated p$^-$ impurity region 15 is formed between the channel stop layer 8 and the highly concentrated n$^+$ impurity region 5a of the LDD MOS transistor.

As described above, the p$^-$ impurity region 15 can be formed simultaneously with the formation of the low concentrated impurity region 5b of the MOS transistor utilizing the ion implantation process. No additional manufacturing process will therefore be necessary.

The above described second embodiment can be applied subsequent to the process of manufacturing the field oxide film 7 by the above described first embodiment. In this case, a semiconductor device having the field oxide film 7, the isolating width of which can be miniaturized, and an improved structure of an MOS transistor in which junction breakdown voltage between the channel stop layer 8 and the source/drain regions is increased.

In the above described embodiments, although the examples are described in which the oblique rotating ion implantation is applied before the formation of the sidewall oxide film 17 of the gate electrode 3, the ion implantation process may be performed after the formation of the sidewall oxide film 17.

Similarly, in the above described embodiments, the examples are described in which the p type silicon substrate 1 is employed, however, a similar method can be applied to an n type silicon substrate 1.

Figure 6A:
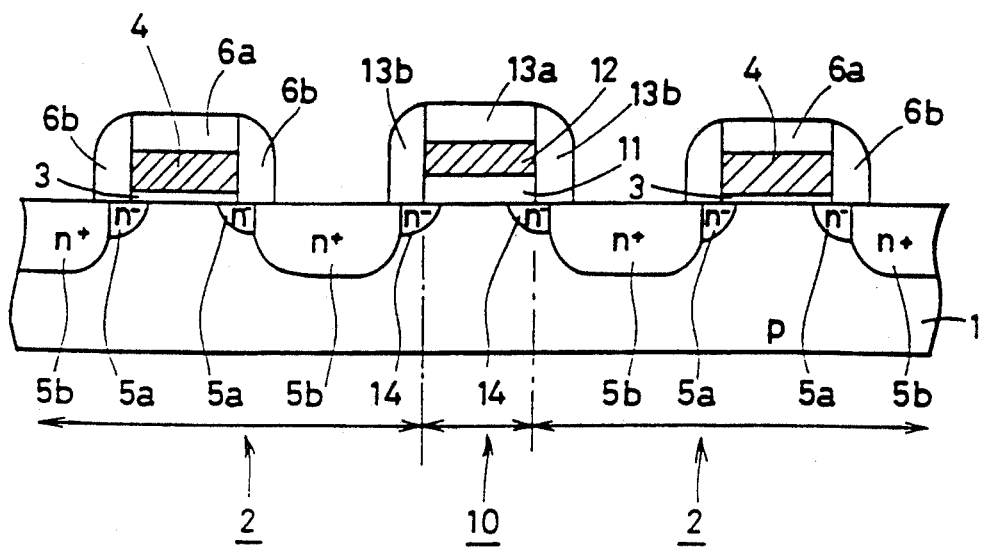
FIG. 6A is a sectional view showing a structure of a semiconductor device having a field shield isolating structure in accordance with a third embodiment of the present invention.
Figure 6B:
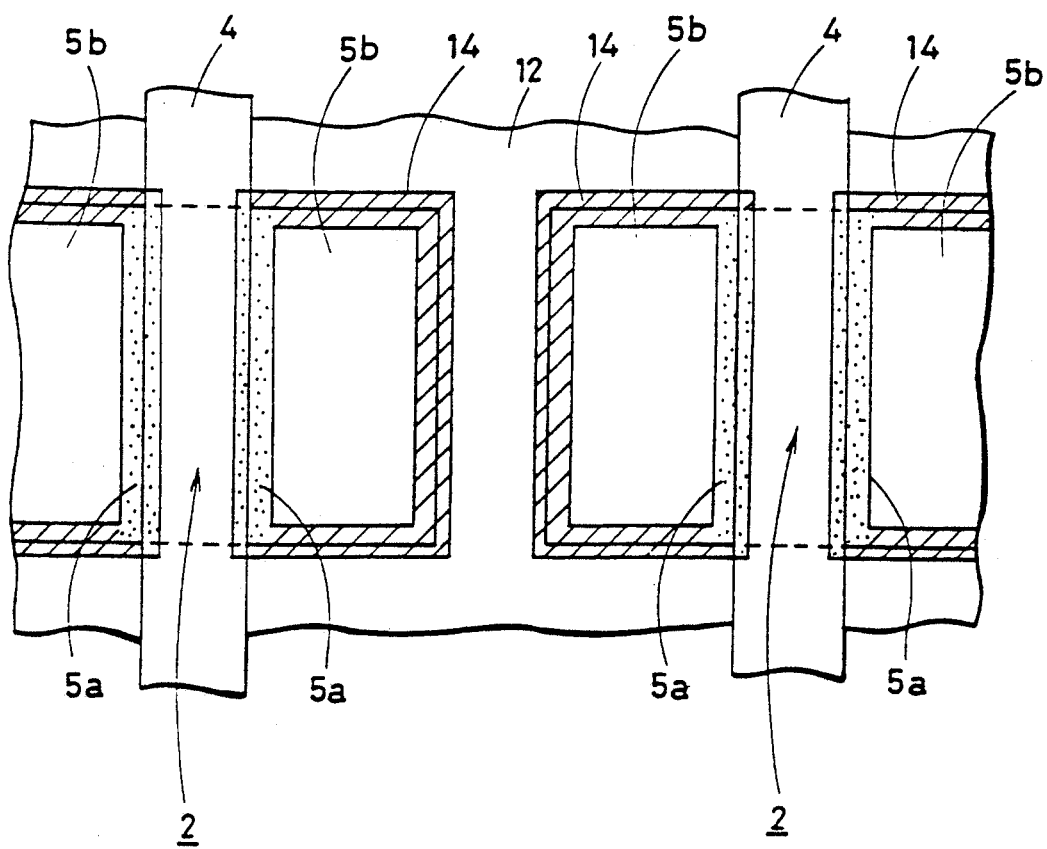
FIG. 6B is a top view of the structure in FIG. 6A.

FIGS. 6A and 6B show a semiconductor device in accordance with a third embodiment. Referring to FIGS. 6A and 6B, a field shield isolating structure 10 in accordance with the present invention is formed between the MOS transistors 2, 2 adjacent to each other. The field shield isolating structure 10 includes a shield gate insulating film (oxide film) 11 having a thickness ranging from about 400 Å to 500 Å on the surface of the p type silicon substrate 1, and a field shield gate electrode 12 formed of polysilicon having a thickness of about 3000 Å formed thereon. The upper surface of the field shield gate electrode layer 12 is covered with an upper insulating layer 13a formed of an oxide film having a thickness about 2000 Å, and the sidewalls of the field shield gate electrode 12 and the shield gate insulating film 11 are covered with sidewall insulating layers 13b each having a thickness of about 3000 Å also formed of an oxide film. Further, low concentrated ($\simeq 10^{18}/cm^3$) n$^-$ impurity regions 14, 14 are formed at the circumferential ends of the n$^+$ source/drain regions 5b, 5b of the adjacent MOS transistors 2, 2. The n$^-$ impurity regions 14, 14 for field relaxation have a concentration equal to that of the low concentrated n$^-$ source/drain regions 5a of the adjacent MOS transistor 2.

Figure 7:
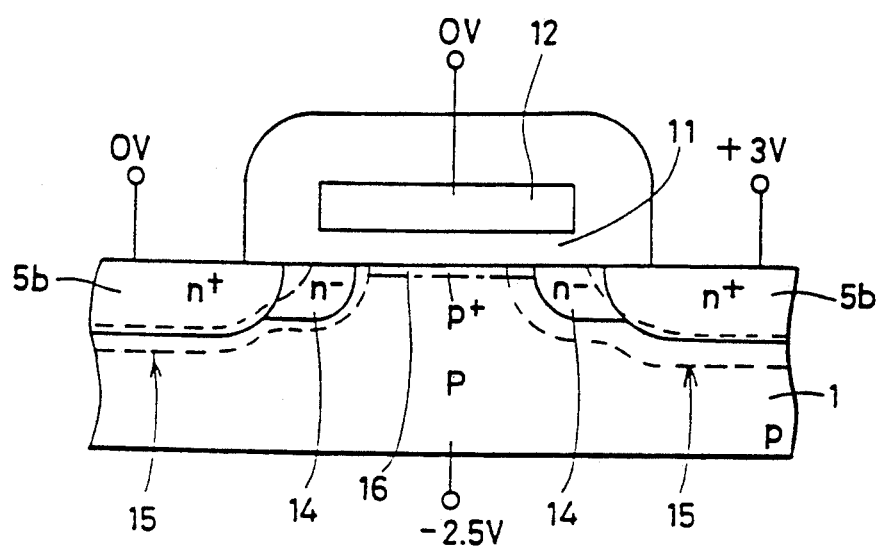
FIG. 7 is an operational diagram of the field shield isolating structure shown in FIG. 6A.

Now, description will be given on the operation of the field shield isolating structure. Referring to FIG. 7, voltages of $-2.5$ V, $+3$ V and 0 V are applied to the p type silicon substrate 1, the source/drain region 5b of one MOS transistor, and the source/drain region 5b of the other MOS transistor, as well as the field shield electrode layer 12, respectively. In the above described state, a p$^+$ impurity region 16 (concentration $\simeq 10^{18}/cm^3$) is induced onto the surface of the substrate immediately below the field shield gate electrode layer 12. A depletion layer 15 is developed at the junction portion between the p type silicon substrate 1, and the source/drain regions 5b and n$^-$ impurity region 14. The depletion layer 15 is formed with its width especially wide in the vicinity of the n$^-$ impurity regions 14, 14. Therefore, there exists the depletion layer 15 which is wide between the p$^+$ region 16 positioned in the isolating region and the adjacent n$^+$ source/drain regions 5b, 5b. The existence of the expanded depletion layer 15 relaxes the electric field of the n$^+$p$^+$ junction portion in the vicinity of the isolating region, thereby improving the junction breakdown voltage.

Now, description will be given on the manufacturing method of the semiconductor device shown in FIG. 6A.

Figure 8A:
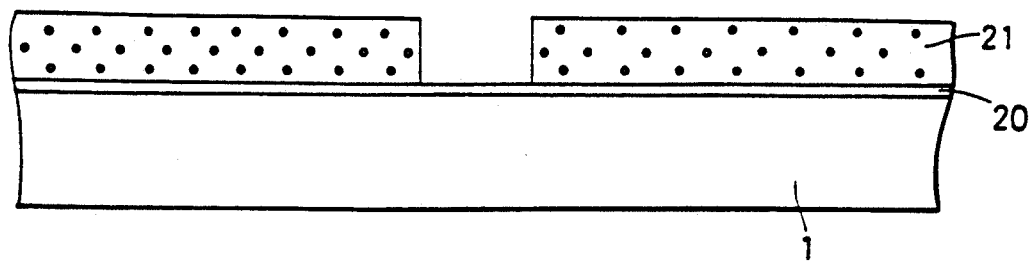
FIGS. 8A, 8B, 8C, 8D, 8E, 8F and 8G are sectional views showing the manufacturing process of the semiconductor device shown in FIG. 6A.

As shown in FIG. 8A, a nitride film 20 is formed on the surface of the p type silicon substrate 10. Further, a resist 21 is applied onto the surface of the nitride film 20, and then patterning is carried out to form an opening only in a region to be an element isolating region.

Figure 8B:
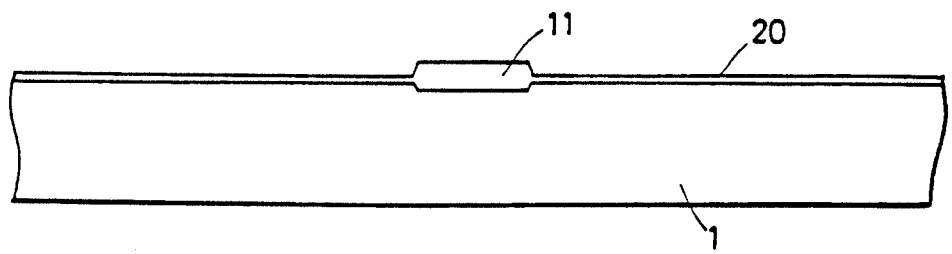

As shown in FIG. 8B, the nitride film 20 is selectively removed using the resist pattern 21 as a mask. Subsequently, the resist 21 is removed. Thermal oxidation treatment is applied to the surface of the p type silicon substrate 1, using the nitride film 20 as a mask. Because of the thermal oxidation treatment applied, a shield gate insulating layer 11 having a thickness ranging from about 400 Å to 500 Å on the surface of the p type silicon substrate 1 to be the element isolating region is formed.

Figure 8C:
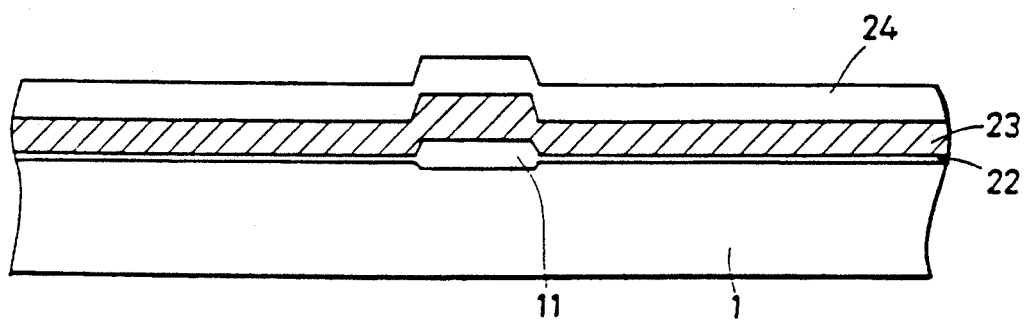

Further, as can be seen from FIG. 8C, after the removal of the nitride film 20, thermal oxidation treatment is applied to the surface of the p type silicon substrate, thereby forming a thermal oxidation film 22 having a thickness of approximately 100 Å. A polysilicon layer 23 having a thickness of about 3000 Å and an oxide film 24 having a thickness of about 2000 Å are deposited on the surface of the thermally oxidized film 22 in the shield gate insulating layer 11 by the CVD method.

Figure 8D:
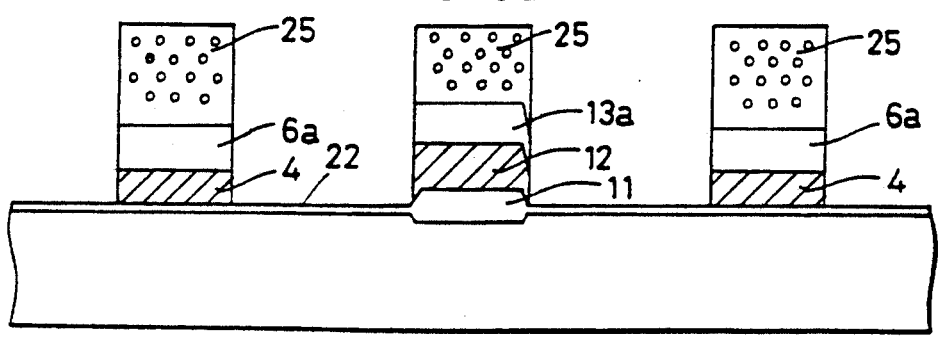

As can be seen from FIG. 8D, a resist 25 is applied onto the surface of the oxide film 24, and the surface is patterned into a prescribed form. The oxide film 24 and the polysilicon layer 23 are sequentially etched and patterned using the patterned resist 25 as a mask to form the gate electrode 4, the upper insulating layer 6a of an MOS transistor and the field shield gate electrode 12 and the upper insulating film 13a of the field shield isolating structure.

Figure 8E:
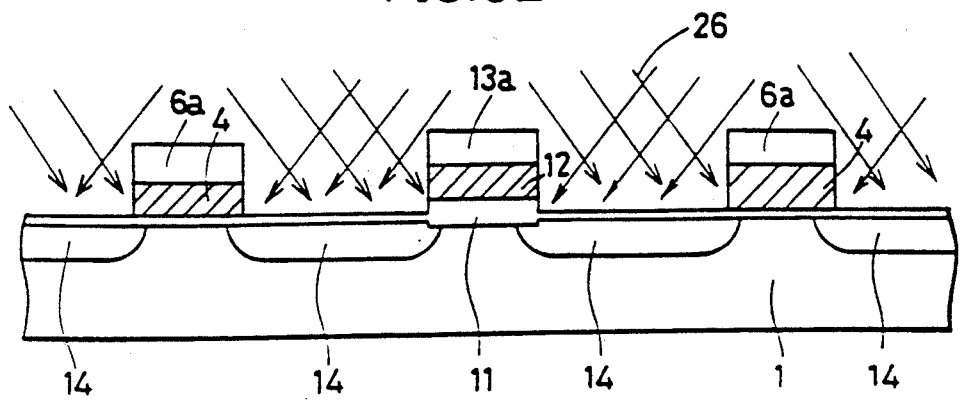

Further, as set forth in FIG. 8E, after the removal of the resist 25, phosphorus (P) ions 26 are implanted onto the surface of the p type silicon substrate 1 by oblique rotating ion implantation, using the gate electrode 4 and the field shield gate electrode 12, etc. as masks. This oblique rotating ion implantation method is a method to implant impurity ions with a prescribed implantation energy while inclining a silicon substrate at a prescribed angle to the direction of ion emission and making the substrate rotate and revolve within a plane including the main surface of the substrate. By virtue of this oblique rotating ion implantation method, an n$^-$ impurity region 14 having a concentration of about $10^{18}/cm^3$ is formed on the surface of the p type silicon substrate. A part of the n$^-$ impurity region 14 can be slipped under the gate electrode 4 and the field shield gate electrode 12. In the subsequent process, the n$^-$ impurity region 14 constitutes each of the n$^-$ source/drain regions 5a of the MOS transistor and the n$^-$ impurity regions 14 for field relaxation in the field shield isolating structure.

Figure 8F:
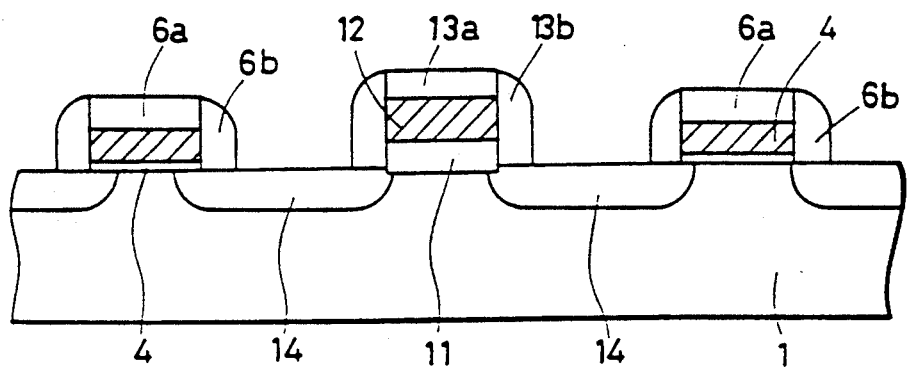

Further, as shown in FIG. 8F, after forming an oxide film entirely over the surface of the p type silicon substrate by CVD method, the oxide film is anisotropically etched and removed selectively. A sidewall insulating layer 6b is formed on the sidewall of the gate electrode due to this process, and a sidewall insulating layer 3b is formed on the sidewall of the field shield gate electrode 12.

Figure 8G:
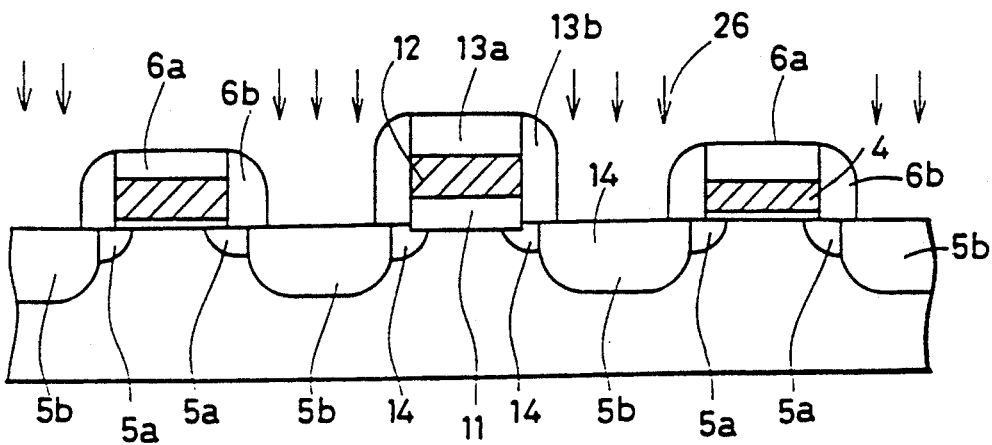

As shown in FIG. 8G, phosphorus ions 26 are then implanted to the surface of the p type silicon substrate 1 in an approximately vertical direction relative to the surface of the substrate, using as masks the gate electrode 4 and the field shield gate electrode 12 covered with the sidewall insulating layers 6b, 13b, respectively. N$^+$ source/drain regions 5b, 5b having an impurity concentration of about $10^{20}/cm^3$ is formed due to the ion implantation process.

The semiconductor device shown in FIG. 6A is manufactured by the above described process.

Figure 9:
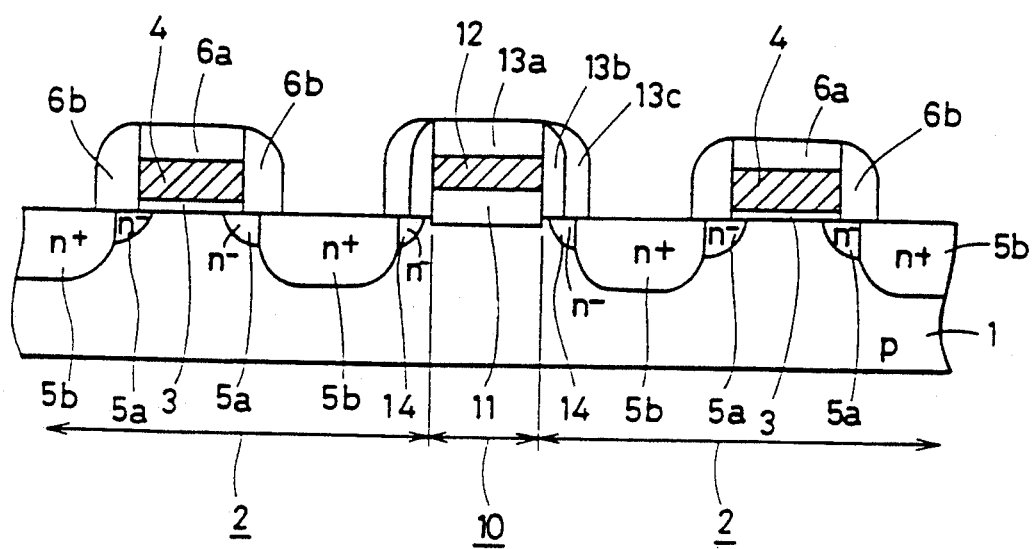
FIG. 9 is a sectional view of a semiconductor device including a field shield isolating structure in accordance with a fourth embodiment of the present invention.

Now, description will be given on a fourth embodiment of the present invention. Referring to FIG. 9, a field shield isolating structure in accordance with the fourth embodiment is characterized in that an n$^-$ impurity region 14 for field relaxation has a structure offset with respect to a field shield gate electrode 12. A shield gate insulating layer 11 is formed thicker than the gate insulating layer 3 of an adjacent MOS transistor. Also in the fourth embodiment, the n$^-$ impurity region 14 helps a depleting layer to extend in the vicinity of the junction, thereby increasing the junction breakdown voltage as a result.

Now, description will be given on the manufacturing method of the semiconductor device in the fourth embodiment.

Figure 10A:
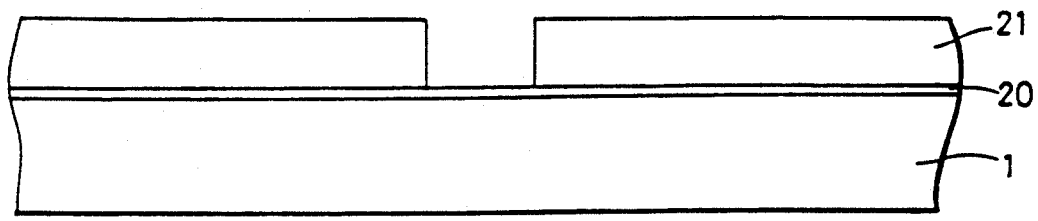
FIGS. 10A, 10B, 10C, 10D, 10E, 10F and 10G are sectional views showing the manufacturing process of the semiconductor device shown in FIG. 9.
Figure 10B:
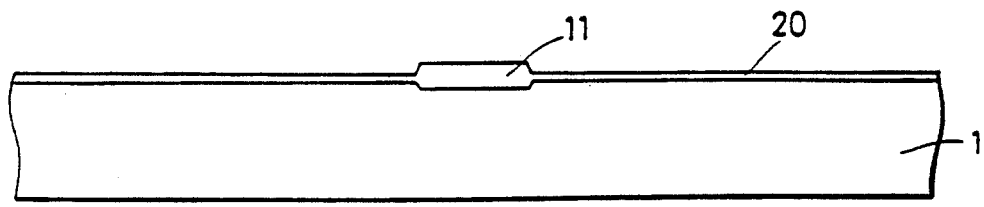
Figure 10C:
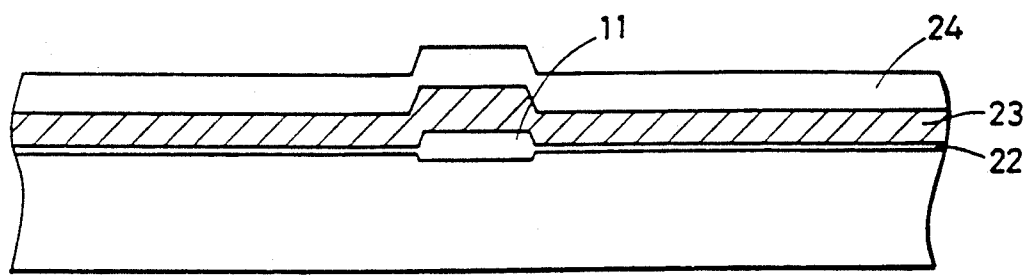

Steps shown in FIGS. 10A to 10C are similar to the steps shown in FIGS. 8A to 8C, the description thereof being omitted.

Figure 10D:
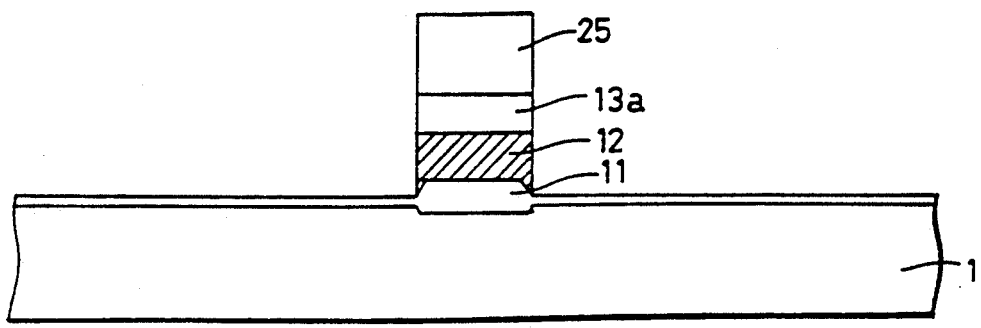

As shown in FIG. 10D, an oxide film 24 is supplied with a resist 25 on the surface, and is patterned into a prescribed form. The oxide film 24 and a polysilicon layer 23 are patterned into a prescribed form using the resist 25 as a mask, and a field shield gate electrode 12 and an insulating layer 13a thereon are formed.

Figure 10E:
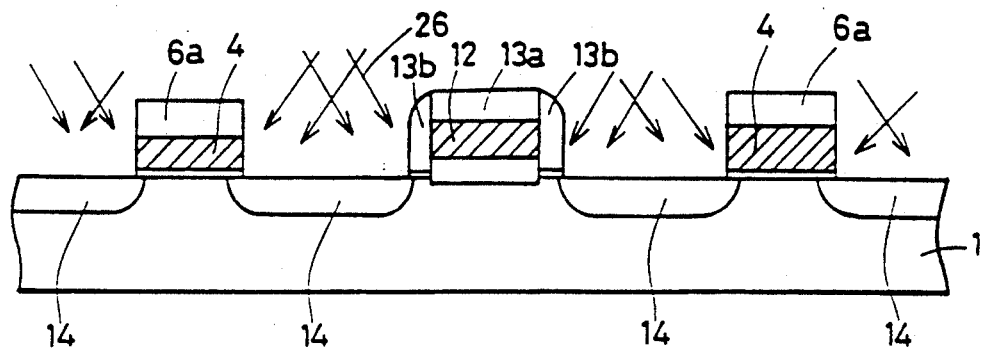

As shown in FIG. 10E, after removal of the resist 25, an oxide film is deposited entirely over the substrate, and the oxide film is selectively removed away by anisotropic etching. Sidewall insulating layers 13b are formed on the sidewalls of the field shield gate electrode 12 by the process. Subsequently, the steps shown in FIGS. 10C to 10D are again performed to form a gate electrode 4 and an insulating layer 6a thereon of MOS transistor. A low concentrated n⁻ impurity region 14 by an oblique rotating ion implantation method, e.g. by implanting phosphorus ions 26 with implantation energy from 100 to 200 keV, and a dose amount $1 \times 10^{13}/cm^2$.

Figure 10F:
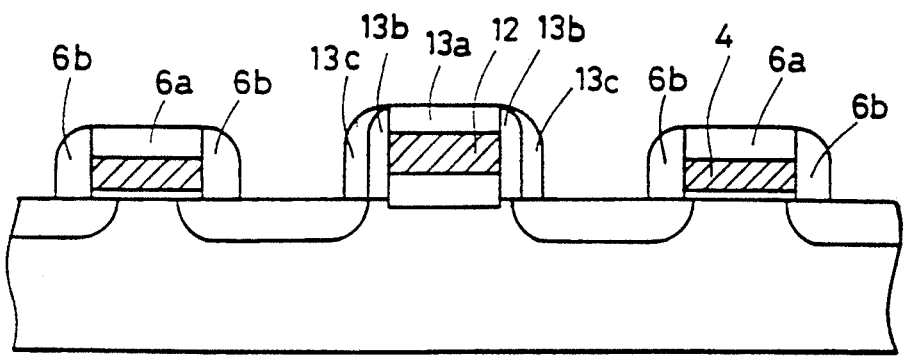

As shown in FIG. 10F, after an oxide film is deposited on the entire surface of the substrate, the oxide film is selectively removed away using anisotropic etching method. Second sidewall oxide films 13c are further formed on the sidewalls of the sidewall oxide films 13b positioned on the sidewalls of the field shield gate electrode 12 by this etching process, and sidewall insulating layers 6b are formed on the sidewalls of the gate electrode 4.

Figure 10G:
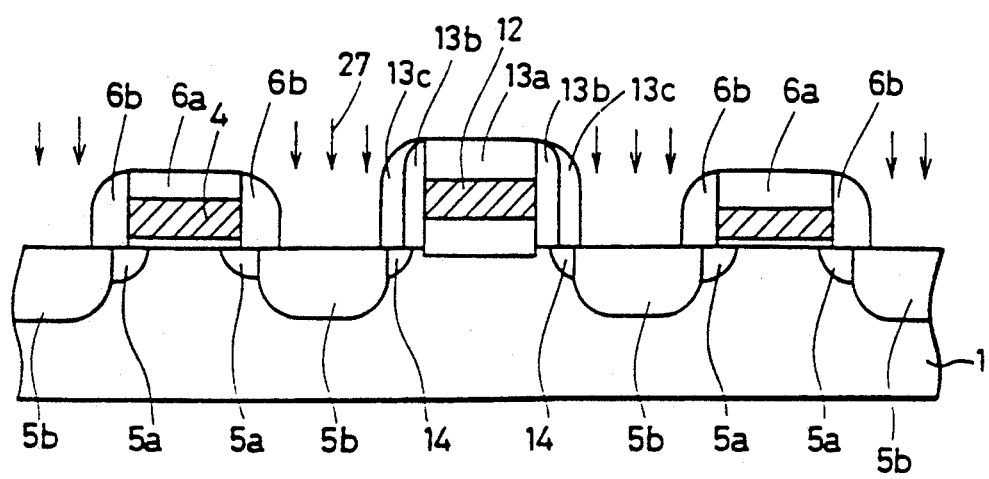

Subsequently, as shown in FIG. 10G, using the field shield gate electrode 12 covered with the first and second sidewall oxide films 13b, 13c and the gate electrode 4 covered with the sidewall insulating layers 6b as masks, for example, arsenic (As) ions 27 are implanted to the surface of the p type silicon substrate in an approximately vertical direction relative to the surface of the substrate with an implantation energy of 700 keV, and a dose amount of about $1 \times 10^{16}/cm^2$. Highly concentrated n⁺ source/drain regions 5b constituting the source/drain regions of the MOS transistor are thus formed. The n⁻ impurity region connected to the channel side of the highly concentrated n source/drain region 5b is to be a low concentrated impurity region 5a having an LDD structure, and a low concentrated impurity region connected to the side of the boundary with the isolating region of the n⁺ source/drain region 5b is to be an n. impurity region 14 for field relaxation. The semiconductor device shown in FIG. 4 is manufactured by the above described process.

Figure 11:
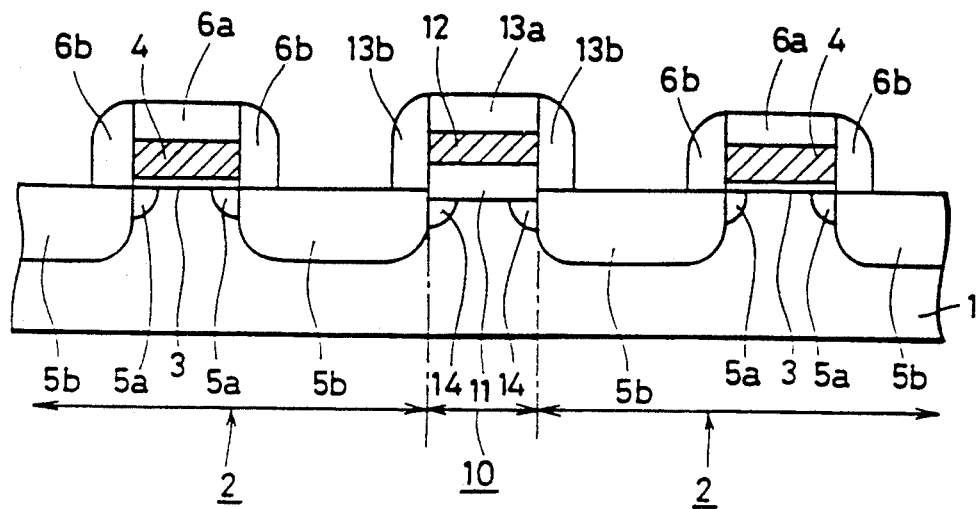
FIG. 11 is a sectional view showing a structure of a semiconductor device including a field shield isolating structure in accordance with a fifth embodiment of the present invention.

Now, description will be given on a fifth embodiment of the present invention. Referring to FIG. 11, the third embodiment is characterized in that an n⁻ impurity region 14 for field relaxation is formed in a position to be completely covered by the field shield gate electrode 12, unlike the first embodiment. Also in this case, the existence of the low concentrated n⁻ impurity region 14 permits expansion of an depletion layer in a junction region in the vicinity of an isolating region, thereby increasing the junction breakdown voltage as a result.

Figure 12A:
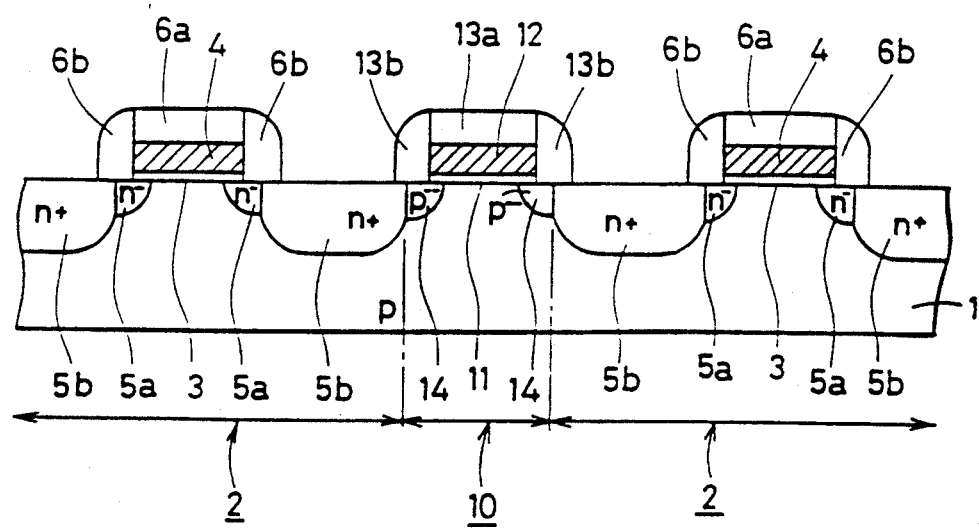
FIG. 12A is a sectional view showing a structure of a semiconductor device including a field shield isolating structure in accordance with a sixth embodiment of the present invention.
Figure 12B:
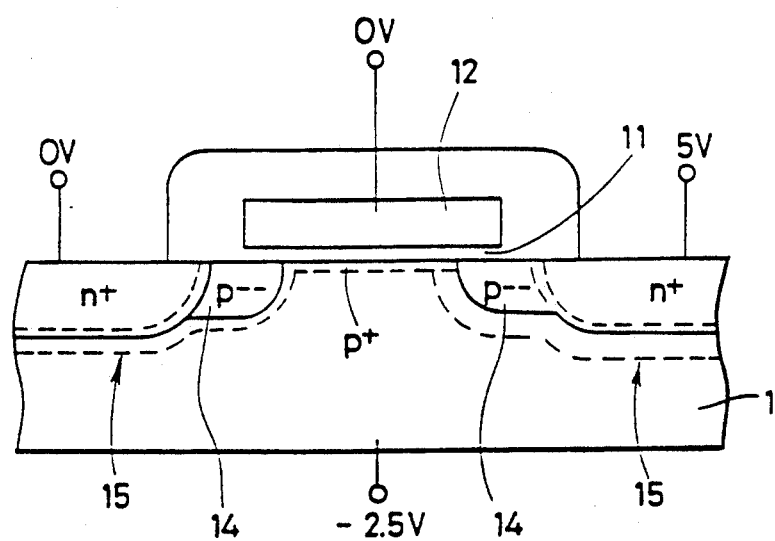
FIG. 12B is an operational diagram showing the field shield isolating structure shown in FIG. 12A.

A sixth embodiment of the present invention will be described. Referring to FIG. 12A, in a field shield isolating structure 10 in accordance with the sixth embodiment, a p⁻⁻ impurity region 14 having a concentration lower than that of the substrate is formed on the surface of a p type silicon substrate 1 along the boundary between highly concentrated n⁺ source/drain regions 5b of adjacent MOS transistors 2 and the field shield gate electrode 12. The shield gate insulating layer 11 of the field shield isolating structure 10 has the same thickness, e.g. about from 100 Å to 200 Å, as that of the gate insulating layer 3 of an adjacent MOS transistor 2. Functions and effects given by such a structure will be described in conjunction with an operational diagram shown in FIG. 12B. In the field shield isolating structure 10 of the sixth embodiment, the shield gate insulating layer 11 has a thickness smaller than that of the third embodiment, and, therefore, a p⁻⁻ impurity region 14 in the vicinity of the field shield gate of is formed of a lower concentrated layer compared to that of the silicon substrate so that the p⁻⁻ impurity region 14 is entirely depleted, thereby expanding the width of a depletion layer to increase the junction breakdown voltage.

Now, description will be given on the manufacturing process of the semiconductor device shown in FIG. 12A.

Figure 13A:
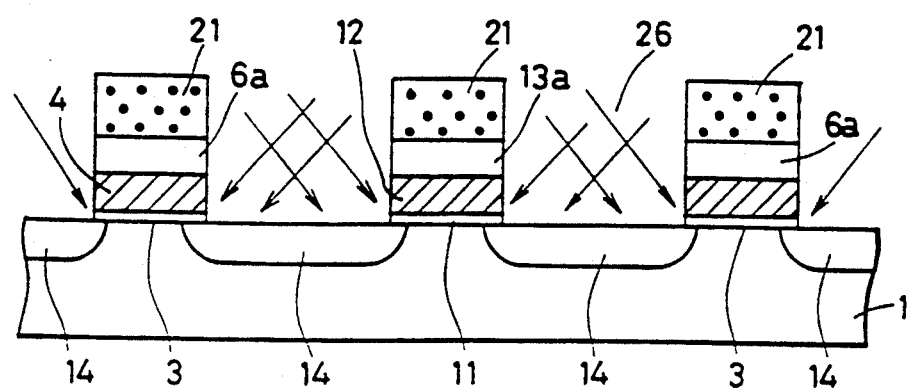
FIGS. 13A, 13B, 13C and 13D are sectional views showing the manufacturing process of the semiconductor device shown in FIG. 12A.

As shown in FIG. 13A, a gate insulating film 3, a gate electrode 4, an upper insulating layer 6a and a shield gate insulating layer 11, a field shield electrode 12, and an upper insulating layer 13a are each formed in a prescribed form on the surface of a p type silicon substrate 1. The process is the same as the process shown in FIGS. 11A to 11B describing the prior art, and therefore the description is omitted. Implantation of ions, e.g., phosphorus ions 26, is applied onto the surface of the substrate by an oblique rotating ion implantation method, using the patterned gate electrode 4 or field shield gate electrode 12 as a mask. A low concentrated p⁻⁻ impurity region 14 is formed on the surface of the substrate by counter-doping the phosphorus ions 26 to the p type silicon substrate 1. The p⁻⁻ impurity region 14 is formed so that a part of the region can be slipped under the field shield gate electrode 12.

Figure 13B:
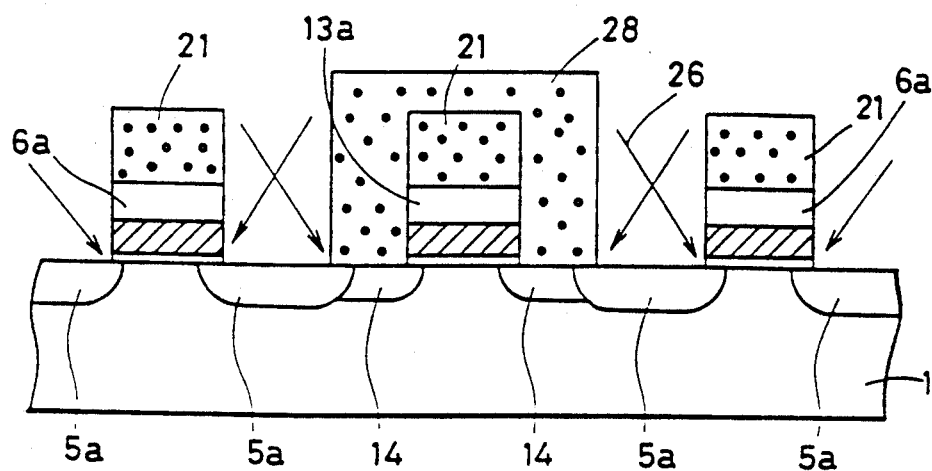

As shown in FIG. 13B, after application of resists onto the surface of the substrate, patterning is applied thereon to form a resist pattern 28 encircling the field shield isolating region. Low concentrated n⁻ impurity regions 5a, 5a are formed on the surface of the substrate by implanting phosphorus ion 26 in accordance with the oblique rotating ion implantation method, using the resist pattern 28, the gate electrode 4 and the upper insulating layer 6a as masks.

Figure 13C:
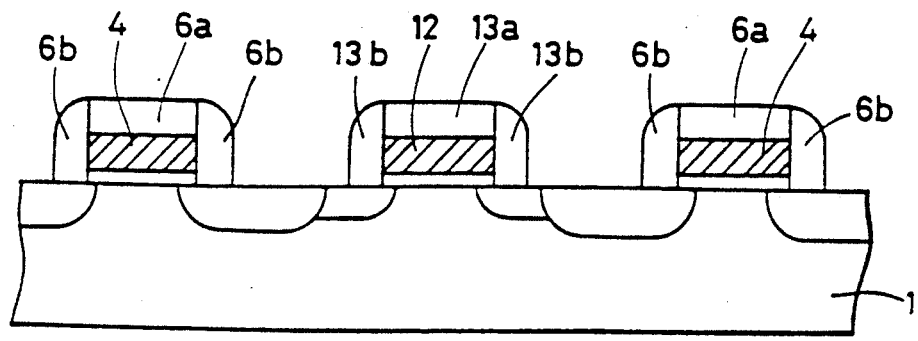

As shown in FIG. 13C, after the resist 28, 21 are removed, a high temperature oxidation film is deposited thickly on the entire surface of the substrate, and anisotropic etching is carried out to form sidewall insulating layers 6b, 13b on the sidewalls of the gate electrode 4 and the field shield gate electrode 12, respectively.

Figure 13D:
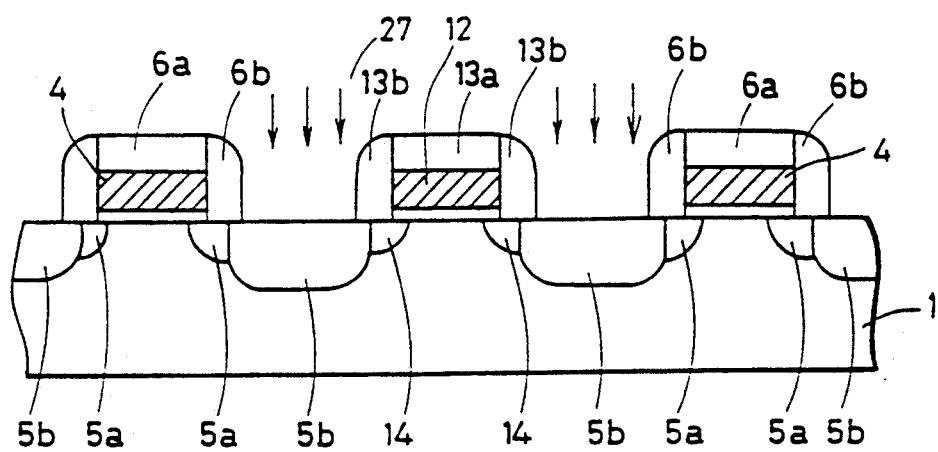

As shown in FIG. 13D, highly concentrated n⁺ source/drain regions 5b, 5b are formed by implanting, for example, arsenic ions 27 in an approximately vertical direction relative to the surface of the substrate, using as masks the gate electrode 4 and the field shield gate electrode 12 covered with the sidewall insulating layers 6b, 13b, respectively. The semiconductor device shown in FIG. 7A is thus manufactured.

As described above, in the present invention, a low concentrated impurity region is formed along the edge of the field shield gate electrode 12 and in contact of the highly concentrated impurity region of an adjacent MOS transistor, and the junction breakdown voltage with the source/drain regions in the field isolating region is improved by adjusting the relation between the thickness of the shield gate insulating film and the concentration of the low concentrated impurity region with each other. When the thickness of the shield gate insulating layer 11 is set to be relatively small, a depleting layer in the region has its extent increased by decreasing the concentration of the low concentrated impurity region compare to the concentration of the substrate, and, on the contrary, when the thickness of the shield gate insulating layer 11 is set to be large, the extent of the depletion layer is adjusted by increasing the concentration of the low concentrated region relatively. The isolating characteristic is enhanced by improving the junction breakdown voltage of the junction formed in the field shield isolating region.

Although the above embodiment was described as referring to the cases in which p type silicon substrates are used, this is by no means of limitation, and it should be noted that similar effects can be obtained by reversing the conductivity types of impurities in case, for example, an n type silicon substrate is employed.

Thus, a low concentrated impurity layer is formed between a channel stop layer formed under an element isolating oxide film and the source/drain regions of a transistor, thereby improving the junction breakdown voltage therebetween. The low concentrated impurity region is formed simultaneously with a low concentrated impurity region constituting an LDD structure of a transistor by employing an oblique rotating ion implanting process, and, therefore, no additional manufacturing process is necessary.

In the present invention, the isolating oxide film is formed by thermal oxidation treatment only after the central portion of the surface of the substrate to be an element isolating region is made into an amorphous state by the oblique rotating ion implanting method, and, therefore, enhanced oxidation due to the amorphous state permits time required for forming the isolating oxide film to be shortened, so that an element isolating film having a miniaturized structure can be manufactured by suppressing the formation of a bird's beak.

As described above, in the semiconductor device having the field shield isolating structure, a low concentrated impurity region, for example, a low concentrated impurity region having the same conductivity type as the source/drain regions, is formed in the vicinity of the junction region with the source/drain regions of an adjacent MOS transistor, and a semiconductor device having a field shield isolating structure with superior isolating characteristics can be implemented, in which the junction breakdown voltage in the junction region is improved by adjusting the thickness of the shield gate insulating layer in accordance with the concentration of the low concentrated impurity region.

In the manufacturing method of the semiconductor device in accordance with the present invention, a semiconductor device having a superior junction breakdown voltage in an isolating region is manufactured without additional manufacturing process, because the process forming a low concentrated impurity region constituting an LDD structure of adjacent MOS transistor by an oblique rotating implanting method is advantageously used to form a low concentrated impurity region in the vicinity of the field shield isolating region.

In a method of manufacturing a semiconductor device in accordance with the present invention, a manufacturing method of a semiconductor device having a field shield isolating structure in which improved junction breakdown voltage is obtained by forming double sidewall insulating layers in the sidewalls of a field shield gate insulating layer to form a low concentrated impurity region in a region offset relative to a field shield gate electrode layer.

In a manufacturing method of a semiconductor device in accordance with a present invention, a semiconductor device having an isolating structure superior in junction breakdown voltage like the above described one is obtained, because a low concentrated impurity region is formed by performing counter-doping to a substrate by an oblique rotating ion implanting method.

What is claimed is:

1. An element isolating structure of a semiconductor device, comprising:

a semiconductor substrate of a first conductivity type having on the main surface an element forming region on which semiconductor elements are formed and an element isolating region surrounding the element forming region;

a gate electrode formed in said element forming region positioned on the surface of said semiconductor substrate with a gate insulating layer therebetween;

a first impurity region of a second conductivity type having a relatively low concentration formed along a side of said gate electrode;

a second impurity region of the second conductivity type having a relatively high concentration, one side of which is in contact with said first impurity region and which is formed on the surface region of said semiconductor substrate surrounded by said gate electrode and said element isolating region;

an element isolating and insulating film formed on said element isolating region, said element isolating film being adjacent to and in contact with said second impurity region;

a channel stop region of the first conductivity type formed in contact with the lower surface of said element isolating and insulating film and in the substrate of said semiconductor device; and a low concentrated impurity region of the first conductivity type formed below said element isolating and insulating film, wherein said low concentrated region of the first conductivity type is positioned between said channel stop region and said highly concentrated impurity region of the second conductivity type.

2. An element isolating structure of a semiconductor device comprising:

a semiconductor substrate of a first conductivity type having a plurality of element forming region in which semiconductor elements are formed and an element isolating region surrounding the circumference of one element forming region for insulating and isolating said one element forming region;

a gate electrode formed on said one element forming region with a gate insulating layer therebetween and extending in a prescribed direction;

a first impurity region of a second conductivity type having a relatively low concentration formed on said semiconductor substrate along a sidewall of said gate electrode;

a second impurity region of the second conductivity type having a relatively high concentration, one side of which is in contact with said first impurity region and which is formed on the surface region of said semiconductor substrate surrounded by said gate electrode and said element isolating region;

a third impurity region of the second conductivity type formed on the surface region of said semiconductor substrate along the boundary between said element isolating region and said one element forming region, and having a concentration lower than that of said second impurity region;

a shield gate insulating layer formed on the main surface of said semiconductor substrate positioned in said element isolating region surrounding said one element forming region and having a thickness larger than that of said gate insulating layer; and a field shield gate electrode layer formed on the surface of said shield gate insulating layer.

3. The element isolating structure of the semiconductor device in accordance with claim 2, further comprising a first sidewall insulating layer for covering the sidewall of the field shield gate electrode and a second sidewall insulating layer for covering the surface of said first sidewall insulating layer.

4. The element isolating structure of the semiconductor device in accordance with claim 2, wherein said third impurity region is formed apart from the end plane of said field shield electrode layer.

5. The element isolating structure of the semiconductor device in accordance with claim 2, wherein at least part of said third impurity region overlaps said field shield electrode layer.

6. An element isolating structure of a semiconductor device, comprising:

a semiconductor substrate of a first conductivity type having a plurality of element forming regions in which semiconductor elements are formed and an element isolating region surrounding the circumference of one element forming region for insulating and isolating said one element forming region;

a gate electrode formed on said element forming region extending in a prescribed direction with a gate insulating layer therebetween and;

a first impurity region of a second conductivity type having a relatively low concentration formed on the surface of said semiconductor substrate along the sidewall of said gate electrode;

a second impurity region of the second conductivity type having a relatively high concentration, one side of which is in contact with said first impurity region and which is formed in the surface region of said semiconductor substrate surrounded by said gate electrode and said element isolating region;

a third impurity region of the first conductivity type formed on the surface region of said semiconductor substrate along the boundary between said element isolating region and said one element forming region, and having a concentration lower than that of said semiconductor substrate;

a shield gate insulating layer formed on the main surface of said semiconductor substrate positioned in said element isolating region surrounding said one element forming region; and a field shield gate electrode layer formed on the surface of said shield gate insulating layer wherein said third impurity region at least partially overlaps said field shield electrode layer.

7. The element isolating structure of the semiconductor device in accordance with claim 1, further comprising a side wall oxide film for covering the sidewall of said gate electrode, another first impurity region of a second conductivity type having a relatively low concentration positioned along the other side of said gate electrode a prescribed distance from said first impurity region, and another second impurity region of a second conductivity type having a relatively high concentration, one side of which is in contact which said other first impurity region and which is formed on the surface region of said semiconductor substrate, wherein said element isolating and insulating film is positioned on the surface of said semiconductor substrate, and said low concentrated impurity region of the first conductivity type is in contact with said channel stop region and said highly concentrated impurity region of the second conductivity type.

8. A semiconductor device formed on a semiconductor substrate of a first conductivity type having a main surface, said semiconductor device comprising:

an active device and an isolating structure separating and insulating the active device from other regions on the main surface of the substrate, wherein the active device comprises:
(i) a gate electrode formed on the main surface of said semiconductor substrate with a gate insulating layer therebetween, and
(ii) a source or drain impurity region of a second conductivity type along a side of said gate electrode;

wherein the isolating structure comprises:
(a) an element isolating and insulating film formed on said element isolating region, said element isolating and insulating film being adjacent to and in contact with said source or drain impurity region,
(b) a channel stop region of the first conductivity type formed in the substrate in contact with the lower surface of said element isolating and insulating film, and
(c) a low concentration impurity region of the first conductivity type formed in the substrate below said element isolating and insulating film, wherein said low concentration impurity region of the first conductivity type is positioned between said channel stop region and said source or drain impurity region.

9. The element isolating structure of the semiconductor device in accordance with claim 2, wherein said third impurity region of the second conductivity type is completely below said field shield gate electrode layer.

10. The element isolating structure of the semiconductor device in accordance with claim 2, wherein said first and third impurity regions have substantially the same concentration of impurities of said second conductivity type.

11. The element isolating structure of the semiconductor device in accordance with claim 6, wherein said shield gate insulating layer and said gate insulating layer have a common thickness.

* * * * *